United States Patent
Ueno et al.

(10) Patent No.: US 10,057,972 B2
(45) Date of Patent: Aug. 21, 2018

(54) EXTREME ULTRAVIOLET LIGHT GENERATION SYSTEM AND METHOD OF GENERATING EXTREME ULTRAVIOLET LIGHT

(71) Applicant: GIGAPHOTON INC., Tochigi (JP)

(72) Inventors: Yoshifumi Ueno, Oyama (JP);
Hirokazu Hosoda, Oyama (JP);
Takayuki Yabu, Oyama (JP)

(73) Assignee: GIGAPHOTON INC., Tochigi (JP)

( * ) Notice: Subject to any disclaimer, the term of this patent is extended or adjusted under 35 U.S.C. 154(b) by 0 days.

(21) Appl. No.: 15/430,737

(22) Filed: Feb. 13, 2017

(65) Prior Publication Data
US 2017/0171955 A1 Jun. 15, 2017

Related U.S. Application Data

(63) Continuation of application No. PCT/JP2014/078325, filed on Oct. 24, 2014.

(51) Int. Cl.
| | |
|---|---|
| H05G 2/00 | (2006.01) |
| H01L 21/027 | (2006.01) |
| H05H 1/24 | (2006.01) |
| H01S 3/10 | (2006.01) |
| H05H 15/00 | (2006.01) |
| G03F 7/20 | (2006.01) |

(52) U.S. Cl.
CPC .......... *H05G 2/008* (2013.01); *G03F 7/70033* (2013.01); *H01L 21/027* (2013.01); *H01S 3/10061* (2013.01); *H05G 2/003* (2013.01); *H05G 2/006* (2013.01); *H05H 1/24* (2013.01); *H05H 15/00* (2013.01)

(58) Field of Classification Search
CPC .......... H05G 2/008; H05G 2/003; G03F 7/00; H01L 21/027; H05H 1/24; H05H 15/00
USPC .................................. 250/493.1, 503.1, 504 R
See application file for complete search history.

(56) References Cited

U.S. PATENT DOCUMENTS

| 2002/0141537 A1 | 10/2002 | Mochizuki |
| 2004/0264512 A1 | 12/2004 | Hartlove et al. |

(Continued)

FOREIGN PATENT DOCUMENTS

| EP | 2538759 A1 | 12/2012 |
| JP | 2002-289397 A | 10/2002 |

(Continued)

OTHER PUBLICATIONS

International Search Report issued in PCT/JP2014/078325; dated Jan. 27, 2015.

(Continued)

*Primary Examiner* — Nicole Ippolito
*Assistant Examiner* — Hanway Chang
(74) *Attorney, Agent, or Firm* — Studebaker & Brackett PC

(57) ABSTRACT

An extreme ultraviolet light generation system may include a laser system and a controller. The laser system may irradiate the first target with a first pulse laser beam to disperse the first target and produce a mist target, and irradiate the mist target with a second pulse laser beam. The controller may measure a mist diameter of the mist target and control, based on the mist diameter, at least one of time to emit the second pulse laser beam and energy of a first pulse laser beam to be used to irradiate the second target.

15 Claims, 25 Drawing Sheets

(56) References Cited

U.S. PATENT DOCUMENTS

| | | |
|---|---|---|
| 2005/0129177 A1 | 6/2005 | Berglund et al. |
| 2006/0192153 A1 | 8/2006 | Bykanov et al. |
| 2006/0255298 A1 | 11/2006 | Bykanov et al. |
| 2010/0090133 A1* | 4/2010 | Endo .................. G03F 7/70033 250/504 R |
| 2012/0248344 A1 | 10/2012 | Wakabayashi et al. |
| 2012/0305811 A1 | 12/2012 | Wakabayashi et al. |
| 2012/0307851 A1 | 12/2012 | Hori et al. |

FOREIGN PATENT DOCUMENTS

| | | |
|---|---|---|
| JP | 2005-017274 A | 1/2005 |
| JP | 2005-525687 A | 8/2005 |
| JP | 2006-244837 A | 9/2006 |
| JP | 2008-532293 A | 8/2008 |
| JP | 2010-003548 A | 1/2010 |
| JP | 2012-134433 A | 7/2012 |
| JP | 2013-020926 A | 1/2013 |

OTHER PUBLICATIONS

Written Opinion issued in PCT/JP2014/078325; dated Jan. 27, 2015.

* cited by examiner

COMPARATIVE EXAMPLE

EXTREME ULTRAVIOLET LIGHT GENERATION SYSTEM AND METHOD OF GENERATING EXTREME ULTRAVIOLET LIGHT

CROSS-REFERENCE TO RELATED APPLICATIONS

The present application is a continuation application of International Application No. PCT/JP2014/078325 filed on Oct. 24, 2014, the content of which is hereby incorporated by reference into this application.

BACKGROUND

1. Technical Field

The present disclosure relates to an extreme ultraviolet light generation system and a method of generating extreme ultraviolet light.

2. Related Art

In recent years, semiconductor production processes have become capable of producing semiconductor devices with increasingly fine feature sizes, as photolithography has been making rapid progress toward finer fabrication. In the next generation of semiconductor production processes, microfabrication with feature sizes at 70 nm to 45 nm, and further, microfabrication with feature sizes of 32 nm or less will be required. In order to meet the demand for microfabrication with feature sizes of 32 nm or less, for example, an exposure apparatus is needed in which a system for generating extreme ultraviolet (EUV) light at a wavelength of approximately 13 nm is combined with a reduced projection reflective optical system.

Three kinds of systems for generating EUV light are known in general, which include a Laser Produced Plasma (LPP) type system in which plasma is generated by irradiating a target material with a laser beam, a Discharge Produced Plasma (DPP) type system in which plasma is generated by electric discharge, and a Synchrotron Radiation (SR) type system in which orbital radiation is used to generate plasma.

SUMMARY

An example of the present disclosure is an extreme ultraviolet light generation system configured to generate extreme ultraviolet light by irradiating a target with a pulse laser beam for a plurality of times to change the target into plasma. The extreme ultraviolet light generation system includes a target supply device configured to supply a first target and supply a second target after the first target, a laser system configured to provide a pulse laser beam to each target supplied from the target supply device, and a controller. The laser system is configured to irradiate the first target with a first pulse laser beam to break and disperse the first target and produce a mist target, and irradiate the mist target with a second pulse laser beam. The controller is configured to measure a mist diameter of the mist target, and control energy of a first pulse laser beam to be used to irradiate the second target based on the mist diameter.

Another example of the present disclosure is an extreme ultraviolet light generation system configured to generate extreme ultraviolet light by irradiating a target with a pulse laser beam for a plurality of times to change the target into plasma. The extreme ultraviolet light generation system includes a target supply device configured to supply a target, a laser system configured to provide a pulse laser beam to the target supplied from the target supply device, and a controller. The laser system is configured to irradiate the target with a first pulse laser beam to produce a mist target, and irradiate the mist target with a second pulse laser beam. The controller is configured to measure a first mist diameter of the mist target, and control time to emit the second pulse laser beam based on the first mist diameter.

Another example of the present disclosure is a method of generating extreme ultraviolet light by irradiating a target with a pulse laser beam to change the target into plasma. The method includes: irradiating a first target with a first pulse laser beam; measuring a mist diameter of a mist target generated from the first target irradiated with the first pulse laser beam; irradiating the mist target with a second pulse laser beam; and controlling energy of a first pulse laser beam to be used to irradiate a second target supplied after the first target, based on the mist diameter.

BRIEF DESCRIPTION OF THE DRAWINGS

Hereinafter, selected embodiments of the present disclosure will be described with reference to the accompanying drawings.

DETAILED DESCRIPTION

Figure 1:
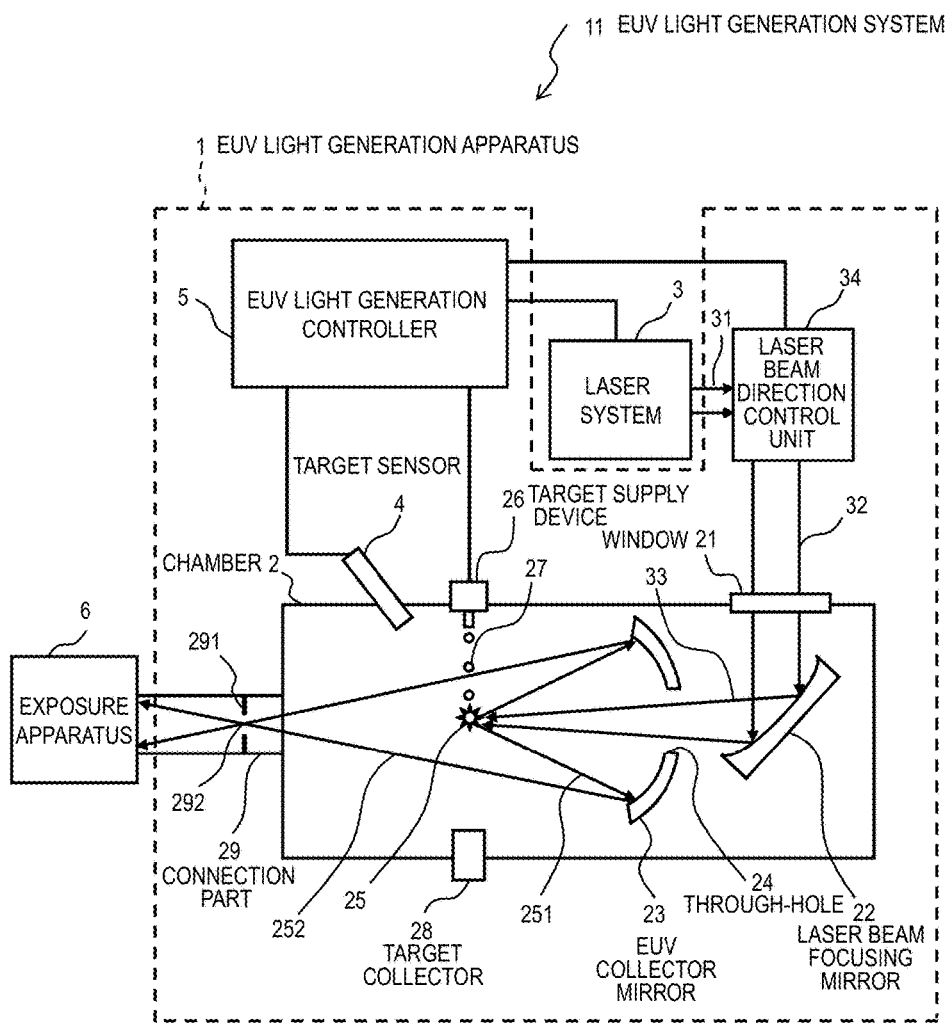
FIG. 1 schematically illustrates an exemplary configuration of an LPP type EUV light generation system.

Contents
1. Overview
2. Terms
3. Overview of EUV Light Generation System
    3.1 Configuration
    3.2 Operation
4. Details of EUV Light Generation System
    4.1 Configuration
    4.2 Operation
5. Comparative Example
    5.1 Configuration
    5.2 States of Target
    5.3 Changes of Central Position of Target
    5.4 Operation
    5.5 Issue on Comparative Example
6. Embodiment 1
7. Embodiment 2
    7.1 Overview
    7.2 Operation
    7.3 Effects
8. Embodiment 3
    8.1 Second Issue on Comparative Example
    8.2 Overview
    8.3 Operation
    8.4 Effects
9. Embodiment 4
    9.1 Overview
    9.2 Operation
    9.3 Effects
10. Embodiment 5
    10.1 Overview
    10.2 Operation
    10.3 Effects
    10.4 Another Operation
    10.5 Effects Hereinafter, selected embodiments of the present disclosure will be described in detail with reference to the accompanying drawings. The embodiments to be described below are merely illustrative in nature and do not limit the scope of the present disclosure. Further, the configuration(s) and operation(s) described in each embodiment are not all essential in implementing the present disclosure. Note that like elements are referenced by like reference numerals and characters, and duplicate descriptions thereof will be omitted herein.

1. OVERVIEW

An LPP type EUV light generation system may generate plasma by irradiating a mist target, which is produced by irradiating a target with a first pre-pulse laser beam, with a second pre-pulse laser beam and a main pulse laser beam successively. This process may improve the efficiency of generation of EUV light.

The inventors found that the diameter of a mist target may vary because of some factors. Specifically, the diameter of a mist target may vary with variation in dispersion velocity of the mist caused by variation in energy of the first pre-pulse laser beam. Further, the diameter of a mist target may vary with variation in position of the target caused by successive generation of plasma. When the mist diameter varies, the efficiency of generation of EUV light may vary to cause instability in EUV light energy.

According to an aspect of the present disclosure, an extreme ultraviolet light generation system may produce a mist target by irradiating a first target with a first pulse laser beam and irradiate the mist target with a second pulse laser beam. The extreme ultraviolet light generation system may measure the mist diameter of the mist target and control at least either one of the energy of the first pulse laser beam to be used to irradiate a second target following the first target and the time to emit the second pulse laser beam to be used to irradiate the mist target. The one aspect of the present disclosure may prevent the variation in mist diameter of a mist target to be irradiated with the second pulse laser beam and as a result, prevent the variation in EUV light energy.

2. TERMS

A "target" is an object to be irradiated with a pulse laser beam introduced into a chamber. The target irradiated with a pulse laser beam turns into plasma and radiates EUV light. A "droplet" is a form of the target supplied into the chamber. A "mist target" is a target broken up and dispersed because of the irradiation with a pulse laser beam. A "mist diameter" is a length of the mist target in a specific direction. A "burst" is, in the case where a pulse laser beam is outputted at a predetermined cyclic frequency during a predetermined time period and is not outputted outside the predetermined time period, a unit of the pulse laser beam outputted at the cyclic frequency in the predetermined time period.

3. OVERVIEW OF EUV LIGHT GENERATION SYSTEM

Configuration

FIG. 1 schematically illustrates an exemplary configuration of an LPP type EUV light generation system. An EUV light generation apparatus 1 may be used with at least one laser system 3. Hereinafter, a system that includes the EUV light generation apparatus 1 and the laser system 3 may be referred to as an EUV light generation system 11. As shown in FIG. 1 and described in detail below, the EUV light generation system 11 may include a chamber 2 and a target supply device 26.

The chamber 2 may be sealed airtight. The target supply device 26 may be mounted onto the chamber 2, for example, to penetrate a wall of the chamber 2. A target material to be supplied by the target supply device 26 may include, but is not limited to, tin, terbium, gadolinium, lithium, xenon, or any combination thereof.

The chamber 2 may have at least one through-hole formed in its wall. One window 21 may be provided to cover the through-hole and the pulse laser beam 32 from the laser system 3 may travel through the window 21. An EUV collector mirror 23 having a spheroidal surface may, for example, be provided in the chamber 2. The EUV collector mirror 23 may have a first focus and a second focus.

The EUV collector mirror 23 may have a multi-layered reflective film including alternately laminated molybdenum layers and silicon layers formed on the surface thereof. The EUV collector mirror 23 is preferably positioned such that the first focus lies in a plasma generation region 25 and the second focus lies in an intermediate focus (IF) region 292. The EUV collector mirror 23 may have a through-hole 24 formed at the center thereof and a pulse laser beam 33 may travel through the through-hole 24.

The EUV light generation apparatus 1 may include an EUV light generation controller 5 and a target sensor 4. The target sensor 4 may have an imaging function and detect at least one of the presence, trajectory, position, and speed of a target.

Further, the EUV light generation system 11 may include a connection part 29 for allowing the interior of the chamber 2 to be in communication with the interior of the exposure apparatus 6. A wall 291 having an aperture may be provided in the connection part 29. The wall 291 may be positioned such that the second focus of the EUV collector mirror 23 lies in the aperture.

The EUV light generation apparatus 1 may also include a laser beam direction control unit 34, a laser beam focusing mirror 22, and a target collector 28 for collecting targets 27. The laser beam direction control unit 34 may include an optical element for defining the direction and an actuator for adjusting the position, the orientation or posture, and the like of the optical element.

3.2 Operation

With reference to FIG. 1, a pulse laser beam 31 outputted from the laser system 3 may pass through the laser beam direction control unit 34 and, as the pulse laser beam 32, travel through the window 21 and enter the chamber 2. The pulse laser beam 32 may travel inside the chamber 2 along at least one beam path, be reflected by the laser beam focusing mirror 22, and strike at least one target 27 as a pulse laser beam 33.

The target supply device 26 may be configured to output the target(s) 27 toward the plasma generation region 25 in the chamber 2. The target 27 may be irradiated with at least one pulse of the pulse laser beam 33. Upon being irradiated with the pulse laser beam, the target 27 may be turned into plasma, and rays of light 251 may be emitted from the plasma.

EUV light 252 in the rays of light 251 may be selectively reflected by the EUV collector mirror 23. EUV light 252 reflected by the EUV collector mirror 23 may be focused at the intermediate focus region 292 and be outputted to the exposure apparatus 6. Here, the target 27 may be irradiated with multiple pulses included in the pulse laser beam 33.

The EUV light generation controller 5 may be configured to integrally control the EUV light generation system 11. The EUV light generation controller 5 may be configured to process image data of the target 27 captured by the target sensor 4. Further, the EUV light generation controller 5 may be configured to control: the timing when the target 27 is outputted and the direction into which the target 27 is outputted, for example.

Furthermore, the EUV light generation controller 5 may be configured to control at least one of: the timing when the laser system 3 oscillates, the direction in which the pulse laser beam 33 travels, and the position at which the pulse laser beam 33 is focused. It will be appreciated that the various controls mentioned above are merely examples, and other controls may be added as necessary.

4. DETAILS OF EUV LIGHT GENERATION SYSTEM

4.1 Configuration

Figure 2:
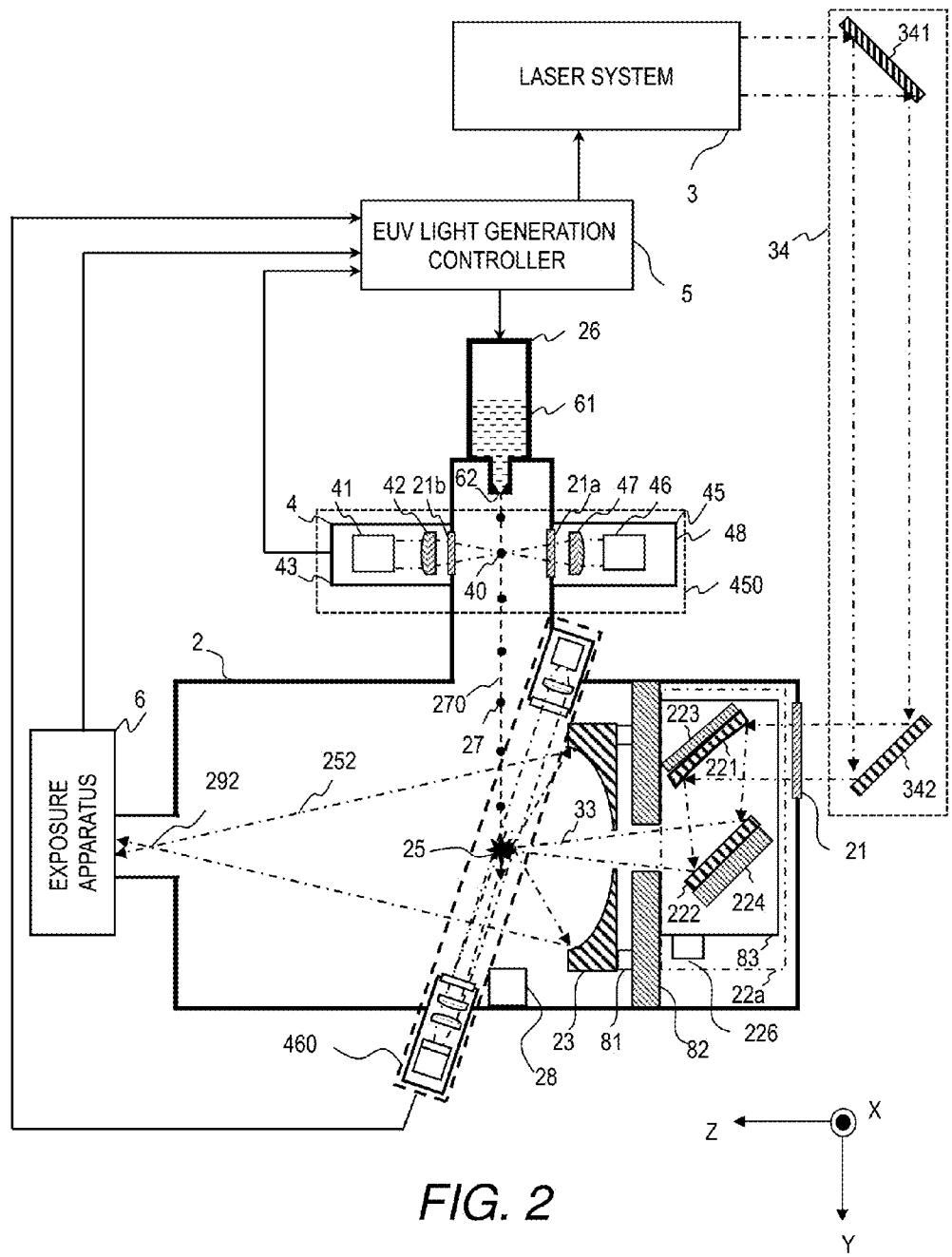
FIG. 2 is a partial cross-sectional diagram of a configuration example of an EUV light generation system.

FIG. 2 is a partial cross-sectional diagram of a configuration example of the EUV light generation system 11. In FIG. 2, the direction of introducing EUV light 252 from the chamber 2 of the EUV light generation apparatus 1 toward the exposure apparatus 6 is defined as Z-axis. X-axis and Y-axis are defined as axes orthogonal to the Z-axis and orthogonal to each other. The subsequent drawings employ the same coordinate axes as those in FIG. 2.

As shown in FIG. 2, a laser beam focusing optical system 22a, the EUV collector mirror 23, the target collector 28, an EUV collector mirror holder 81, and plates 82 and 83 may be provided within the chamber 2.

The plate 82 may be anchored to the chamber 2. The plate 83 may be anchored to the plate 82. The EUV collector mirror 23 may be anchored to the plate 82 with the EUV collector mirror holder 81.

The plate 83 may be able to change its position and orientation with a three-axis stage 226. The three-axis stage 226 may move the plate 83 in the directions of the three axes of the X-direction, the Y-direction, and the Z-direction. The three-axis stage 226 may be connected with a laser controller 55, which will be described later. The three-axis stage 226 may move the plate 83 in accordance with a control signal of the laser controller 55 to change the position and orientation of the plate 83.

The laser beam focusing optical system 22a may be anchored to the plate 83. The laser beam focusing optical system 22a may include an off-axis parabolic mirror 221, a flat mirror 222, and holders 223 and 224. The off-axis parabolic mirror 221 and the flat mirror 222 may be held by the holders 223 and 224, respectively. The holders 223 and 224 may be anchored to the plate 83.

The positions and orientations of the off-axis parabolic mirror 221 and the flat mirror 222 may be held so that the pulse laser beam 33 reflected by those mirrors is focused at the plasma generation region 25. The target collector 28 may be disposed upon a straight line extending from the trajectory 270 of targets 27.

The target supply device 26 may be attached to the chamber 2. The target supply device 26 may include a reservoir 61. The reservoir 61 may hold a target material that has been melted using a heater 261 shown in FIG. 3. An opening serving as a nozzle opening 62 may be formed in the reservoir 61.

Part of the reservoir 61 may be placed in a through-hole formed in a wall of the chamber 2 so that the nozzle opening 62 formed in the reservoir 61 is positioned inside the chamber 2. The target supply device 26 may supply the melted target material to the plasma generation region 25 within the chamber 2 as droplet-shaped targets 27 through the nozzle opening 62. In the present disclosure, the targets 27 may also be referred to as droplets 27.

A timing sensor 450 may be attached to the chamber 2. The timing sensor 450 may include a target sensor 4 and a light-emitting unit 45. The target sensor 4 may include a photodetector 41, a light-receiving optical system 42, and a receptacle 43. The light-emitting unit 45 may include a light source 46, an illumination optical system 47, and a receptacle 48. The illumination optical system 47 may include a cylindrical lens. Light outputted from the light source 46 may be focused by the illumination optical system 47. The focal position of the outputted light may be located substantially upon the trajectory 270 of the targets 27.

The target sensor 4 and the light-emitting unit 45 may be disposed opposite to each other on either side of the trajectory 270 of the targets 27. Windows 21a and 21b may be provided in the chamber 2. The window 21a may be positioned between the light-emitting unit 45 and the trajectory 270 of the targets 27. The window 21b may be positioned between the photodetector 41 and the trajectory 270 of the targets 27.

The light-emitting unit 45 may focus light at a predetermined position on the trajectory 270 of the targets 27 through the window 21a. When a target 27 passes through the focal region of the light emitted from the light-emitting unit 45, the target sensor 4 may detect a change in the light passing through the trajectory 270 of the target 27 and the vicinity thereof. The light-receiving optical system 42 may form, upon a light-receiving surface of the target sensor 4, an image of the trajectory 270 of the target 27 and the vicinity thereof, in order to improve the accuracy of the detection of the target 27. In the example shown in FIG. 2, the detection region for the target sensor 4 to detect the target 27 may substantially match the focal region 40 of the light emitted from the light-emitting unit 45.

An image measurement device 460 may be attached to the chamber 2. The image measurement device 460 may be provided on the wall of the chamber 2 in the vicinity of the plasma generation region 25. The image measurement device 460 may be disposed on the target trajectory 270 downstream the timing sensor 450. The image measurement device 460 may take an image of the plasma generation region 25 and the vicinity thereof in the chamber 2 and create image data thereof. The image measurement device 460 may measure the image of the target 27 that has reached the plasma generation region 25.

The laser beam direction control unit 34 and the EUV light generation controller 5 may be provided outside the chamber 2. The laser beam direction control unit 34 may include high-reflecting mirrors 341 and 342. The high-reflecting mirrors 341 and 342 may conduct the pulse laser beam outputted by the laser system 3 to the laser beam focusing optical system 22a via the window 21.

The EUV light generation controller 5 may receive signals from the exposure apparatus 6, the target sensor 4, and the image measurement device 460 and control the target supply device 26 and the laser system 3.

4.2 Operation

Figure 3:
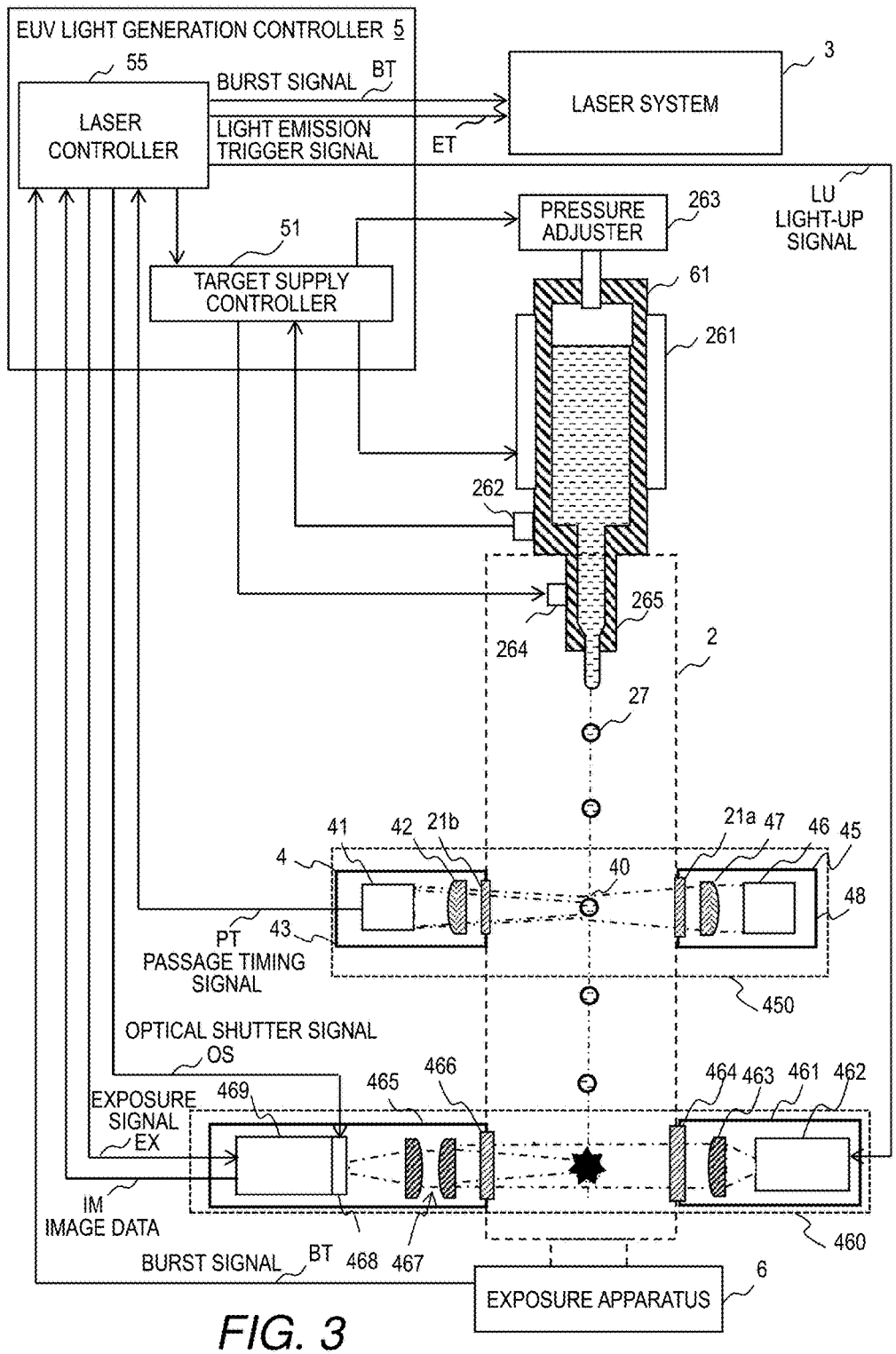
FIG. 3 is a block diagram for illustrating control of a target supply device and a laser system by an EUV light generation controller.

FIG. 3 is a block diagram for illustrating control of the target supply device 26 and the laser system 3 performed by the EUV light generation controller 5. The EUV light generation controller 5 may include a target supply controller 51 and a laser controller 55. The target supply controller 51 may control operations performed by the target supply device 26. The laser controller 55 may control operations performed by the laser system 3 and the target supply device 26.

In addition to the reservoir 61 that holds the material of targets 27 in a melted state, the target supply device 26 may include a heater 261, a temperature sensor 262, a pressure adjuster 263, a piezoelectric element 264, and a nozzle 265.

The heater 261 and the temperature sensor 262 may be anchored to the reservoir 61. The piezoelectric element 264 may be anchored to the nozzle 265. The nozzle 265 may have the nozzle opening 62 for outputting targets 27, which are droplets of liquid tin, for example. The pressure adjuster 263 may be provided in a pipe located between a not-shown inert gas supply unit and the reservoir 61 to adjust the pressure of the inert gas supplied from the inert gas supply unit into the reservoir 61.

The target supply controller 51 may control the heater 261 based on a value detected by the temperature sensor 262. For example, the target supply controller 51 may control the heater 261 so that the tin within the reservoir 61 reaches a predetermined temperature higher than or equal to the melting point of the tin. As a result, the reservoir 61 may melt the tin held therewithin. The melting point of tin is 232° C.; the predetermined temperature may be a temperature of 250° C. to 300° C., for example.

The target supply controller 51 may control the pressure within the reservoir 61 using the pressure adjuster 263. The pressure adjuster 263 may adjust the pressure within the reservoir 61 under the control of the target supply controller 51 so that the targets 27 reach the plasma generation region 25 at a predetermined velocity. The target supply controller 51 may send an electrical signal having a predetermined frequency to the piezoelectric element 264. The piezoelectric element 264 may vibrate in response to the received electrical signal, causing the nozzle 265 to vibrate at the stated frequency.

Consequently, the droplet-shaped targets 27 having a predetermined interval may be generated with a predetermined interval from a jet of the liquid tin outputted from the nozzle opening 62 as a result of the piezoelectric element 264 causing the nozzle opening 62 to vibrate. In this manner, the target supply device 26 may supply the droplet-shaped targets 27 to the plasma generation region 25 at a predetermined velocity and a predetermined interval. For example, the target supply device 26 may generate droplets at a predetermined frequency within a range of several 10 kHz to several 100 kHz.

The timing sensor 450 may detect a target 27 passing through a predetermined region. When a target 27 passes through the focal region of the light produced by the light-emitting unit 45, the target sensor 4 may detect a change in the light passing through the trajectory of the target 27 and the vicinity thereof and output a passage timing signal PT as a detection signal of the target 27. The passage timing signal PT may be outputted to the laser controller 55 each time a target 27 is detected.

The image measurement device 460 may include a light source unit 461 and an imaging unit 465. The light source unit 461 and the imaging unit 465 may be disposed to face each other across the plasma generation region 25 on the target trajectory 270. The direction of facing of the light source unit 461 and the imaging unit 465 may be orthogonal to the target trajectory 270. The direction of facing of the light source unit 461 and the imaging unit 465 may be a different one.

The light source unit 461 may illuminate the target 27 traveling along the target trajectory 270 and having reached the plasma generation region 25 with pulse light. The light source unit 461 may include a light source 462, an illumination optical system 463, and a window 464. The light source 462 may be a light source that emits pulse flashing light, like a xenon flash lamp or a laser. The light source 462 may be connected with the laser controller 55. The light source 462 may receive a light-up signal LU outputted from the laser controller 55. The light-up signal LU outputted from the laser controller 55 may be a control signal for controlling the operation of the light source 462 so that the light source 462 may emit pulse light in a predetermined timely manner. The light source 462 may emit pulse light based on the light-up signal LU of the laser controller 55.

The illumination optical system 463 may be an optical system like a collimator and composed of an optical element such as a lens. The illumination optical system 463 may direct the pulse light emitted from the light source 462 to the plasma generation region 25 on the target trajectory 270 through the window 464.

The above-described configuration may enable the light source unit 461 to emit pulse light toward the plasma generation region 25 on the target trajectory 270. When a target 27 traveling along the target trajectory 270 has reached the plasma generation region 25, the pulse light emitted from the light source unit 461 may illuminate the target 27.

The imaging unit 465 may take an image of the shadow of the target 27 illuminated by the light source unit 461 with the pulse light and output the image data to the laser controller 55. The imaging unit 465 may include an image sensor 469, a transfer optical system 467, and a window 466. The transfer optical system 467 may be optical elements such as a pair of lenses. The transfer optical system 467 may form the shadow of the target 27 at the plasma generation region 25 directed through the window 466 on the light-receiving surface of the image sensor 469.

The image sensor 469 may be a two-dimensional image sensor such as a CCD. The image sensor 469 may take an image of the shadow of the target 27 formed by the transfer optical system 467. The image sensor 469 may include a shutter 468. The shutter 468 may be an electrical shutter or a mechanical shutter. The shutter 468 may be controlled to open or close in accordance with an optical shutter signal OS outputted from the laser controller 55. The image sensor 469 may be configured to take an image only when the shutter 468 is open.

The image sensor 469 may be connected with the laser controller 55. The image sensor 469 may receive an exposure signal EX outputted from the laser controller 55. The exposure signal EX outputted from the laser controller 55 may be a control signal for controlling the operation of the image sensor 469 so that the image sensor 469 will take an image of the shadow of a target 27 in a predetermined timely manner.

The image sensor 469 may take an image of the shadow of the target 27 based on the exposure signal EX of the laser controller 55. The image sensor 469 may create image data of the captured image of the shadow of the target 27. The image sensor 469 may output the created image data IM to the laser controller 55.

The above-described configuration may enable the image measurement device 460 to output the image data of a target 27 that has reached the plasma generation region 25 to the laser controller 55. The laser controller 55 may hence acquire the image data IM of the target 27 that has reached the plasma generation region 25.

The image measurement device 460 may acquire image data of the primary target (droplet), the secondary target, the tertiary target, and plasma light and output the image data to the laser controller 55 in accordance with the timing control for taking images performed by the laser controller 55.

The laser controller 55 may receive a burst signal BT from the exposure apparatus 6. The burst signal BT may be a signal for instructing the EUV light generation system 11 to generate EUV light within a specified period. The laser controller 55 may perform control to output EUV light to the exposure apparatus 6 during the specified period.

The laser controller 55 may control the laser system 3 to output a pulse laser beam in accordance with the passage timing signal PT in the period where the burst signal BT is ON. The laser controller 55 may control the laser system 3 not to output a pulse laser beam in the period where the burst signal BT is OFF.

For example, the laser controller 55 may output, to the laser system 3, the burst signal BT received from the exposure apparatus 6 and a light emission trigger signal ET delayed by a predetermined time from the passage timing signal PT. When the burst signal BT is ON, the laser system 3 may output a pulse laser beam in response to the light emission trigger signal ET. The laser controller 55 may control the light emission trigger signal ET based on the image data IM from the image measurement device 460.

5. COMPARATIVE EXAMPLE

5.1 Configuration

Figure 4:
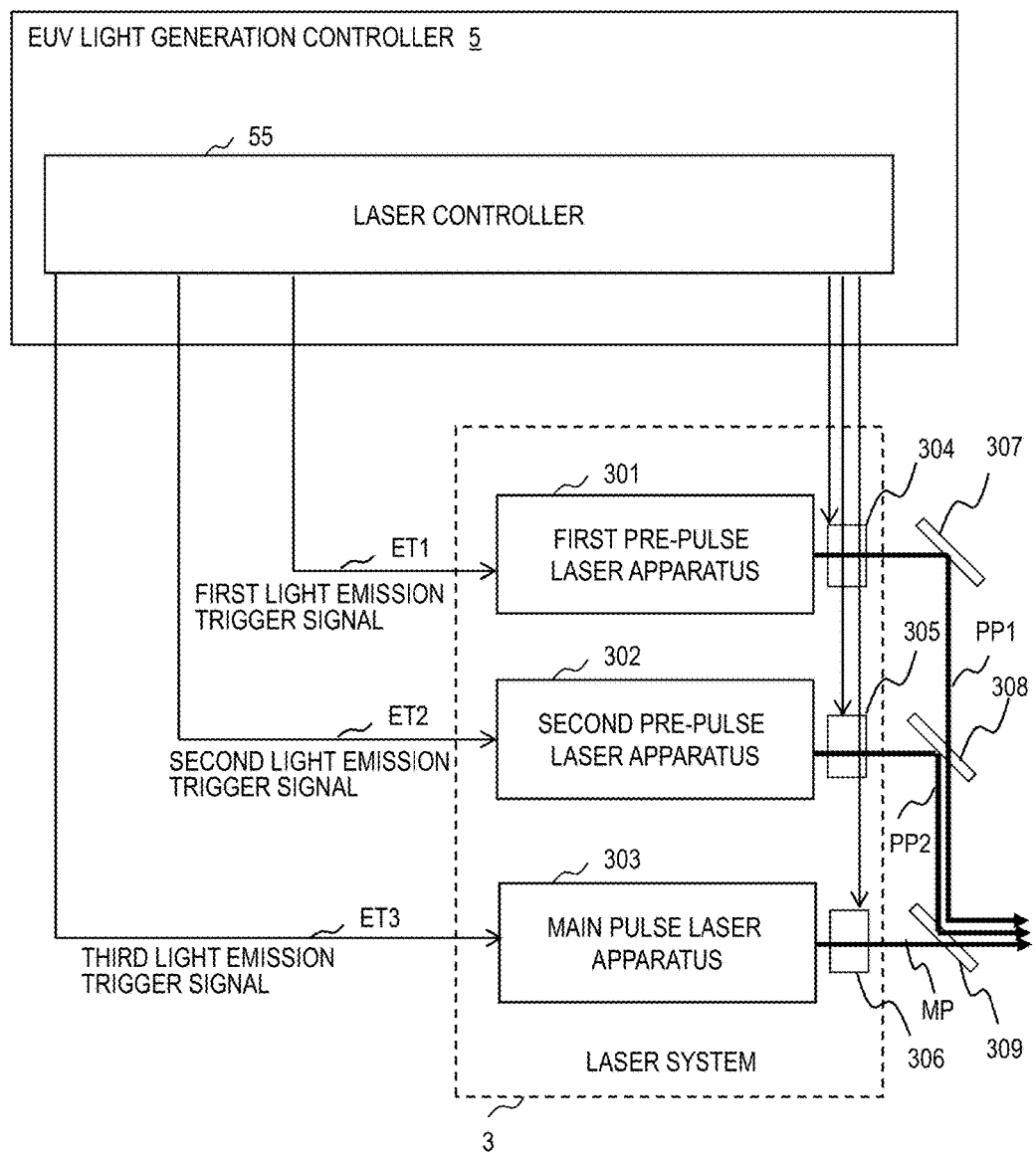
FIG. 4 illustrates a partial configuration of an EUV light generation system including a first pre-pulse laser apparatus and a second pre-pulse laser apparatus in a comparative example.

FIG. 4 illustrates a partial configuration of an EUV light generation system 11 including a first pre-pulse laser apparatus 301 and a second pre-pulse laser apparatus 302 in a comparative example. The laser system 3 may include a first pre-pulse laser apparatus 301, a second pre-pulse laser apparatus 302, and a main pulse laser apparatus 303. The laser system 3 may further include a high-reflecting mirror 307, a first beam combiner 308, a second beam combiner 309, a first beam adjustment device 304, a second beam adjustment device 305, and a third beam adjustment device 306.

The first pre-pulse laser apparatus 301 may be a laser apparatus that outputs a laser beam having a picosecond pulse width not less than 100 fs and less than 1 ns or a laser apparatus that outputs a laser beam having a nanosecond pulse width not less than 1 ns. The first pre-pulse laser apparatus 301 may be a solid-state laser apparatus. The solid-state laser apparatus may be a Nd:YAG laser or a Nd:YVO4 laser and output harmonic light specific thereto. The first pre-pulse laser apparatus 301 may also be a gas laser apparatus. The gas laser apparatus may be a CO2 laser or an excimer laser, for example. The first pre-pulse laser apparatus 301 may output a linearly-polarized laser beam.

The second pre-pulse laser apparatus 302 may be a laser apparatus that outputs a laser beam having a picosecond pulse width or a laser apparatus that outputs a laser beam having a nanosecond pulse width. The second pre-pulse laser apparatus 302 may be a solid-state laser apparatus. The solid-state laser apparatus may be a Nd:YAG laser or a Nd:YVO4 laser and output harmonic light specific thereto. The second pre-pulse laser apparatus 302 may also be a gas laser apparatus. The gas laser apparatus may be a CO2 laser or an excimer laser, for example. The second pre-pulse laser apparatus 302 may output a linearly-polarized laser beam polarized differently from the first pre-pulse laser beam.

The main pulse laser apparatus 303 may be a CO2 laser apparatus for outputting a main pulse laser beam MP. The main pulse laser beam MP may be a laser beam having a wavelength different from both of the pre-pulse laser beam PP1 and the pre-pulse laser beam PP2.

The high-reflecting mirror 307 may be a high-reflecting mirror. Alternatively, the high-reflecting mirror 307 may be a polarizing beam splitter. The high-reflecting mirror 307 may be configured to reflect the first pre-pulse laser beam PP1 at high reflectance.

The first beam combiner 308 may be disposed to make the optical axis of the first pre-pulse laser beam PP1 substantially match the optical axis of the second pre-pulse laser beam PP2. The first beam combiner 308 may reflect the first pre-pulse laser beam PP1 at high reflectance and transmit the second pre-pulse laser beam PP2 at high transmittance.

The second beam combiner 309 may be disposed to make the optical axes of the first pre-pulse laser beam PP1 and the second pre-pulse laser beam PP2 substantially match the optical axis of the main pulse laser beam MP. The second beam combiner 309 may reflect the first pre-pulse laser beam PP1 and the second pre-pulse laser beam PP2 at high reflectance and transmit the main pulse laser beam MP at high transmittance.

The first beam adjustment device 304, the second beam adjustment device 305, and the third beam adjustment device 306 may be disposed on the optical paths of the first pre-pulse laser beam PP1, the second pre-pulse laser beam PP2, and the main pulse laser beam MP, respectively. Each of the first beam adjustment device 304, the second beam adjustment device 305, and the third beam adjustment device 306 may adjust the wavefront and the direction of the laser beam incident thereon under the control of the laser controller 55 and output the adjusted laser beam.

The laser controller 55 may output a first light emission trigger signal ET1 to the first pre-pulse laser apparatus 301. In response to the first light emission trigger signal ET1, the first pre-pulse laser apparatus 301 may output a first pre-pulse laser beam PP1 having the energy specified by the first light emission trigger signal ET1.

The laser controller 55 may output a second light emission trigger signal ET2 to the second pre-pulse laser apparatus 302. In response to the second light emission trigger signal ET2, the second pre-pulse laser apparatus 302 may output a second pre-pulse laser beam PP2 having the energy specified by the second light emission trigger signal ET2.

The laser controller 55 may output a third light emission trigger signal ET3 to the main pulse laser apparatus 303. In response to the third light emission trigger signal ET3, the main pulse laser apparatus 303 may output a main pulse laser beam MP having the energy specified by the third light emission trigger signal ET3.

The laser controller 55 may output the first light emission trigger signal ET1, the second light emission trigger signal ET2, and the third light emission trigger signal ET3 in this order after receipt of a passage timing signal PT from the timing sensor 450. The laser controller 55 may delay outputting the first light emission trigger signal ET1, the second light emission trigger signal ET2, and the third light emission trigger signal ET3 by predetermined different times from the passage timing signal PT. The laser system 3 may provide pulse laser beams to a target 27 in the order of the first pre-pulse laser beam PP1, the second pre-pulse laser beam PP2, and the main pulse laser beam MP.

5.2 States of Target

Figure 5A:
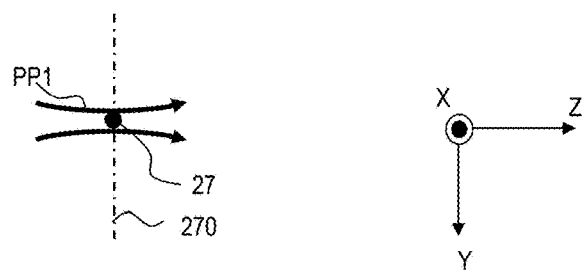
FIG. 5A schematically illustrates a state of a target when being irradiated with a first pre-pulse laser beam.

FIG. 5A schematically illustrates a state of a target when being irradiated with a first pre-pulse laser beam PP1. The broken line 270 may represent the trajectory of the target 27 and its extension. The pre-pulse laser beam PP1 may have a focal diameter substantially equal to or a little larger than the diameter of the target 27. For example, the focal diameter of the pre-pulse laser beam PP1 may be 20 µm to 100 µm.

Figure 5B:
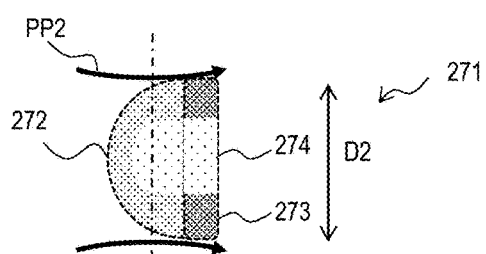
FIG. 5B schematically illustrates a state of a target when being irradiated with a second pre-pulse laser beam.

FIG. 5B schematically illustrates a state of a target when being irradiated with a second pre-pulse laser beam PP2. In response to irradiation with a first pre-pulse laser beam PP1, the droplet-shaped target 27 may be broken into a plurality of particles and dispersed, so that a secondary target 271 may be generated.

The density of the dots in FIG. 5B may correspond to the distribution density of the target material. As shown in FIG. 5B, the secondary target 271 generated by being irradiated with a first pre-pulse laser beam PP1 may have a disc part 273 and a dome part 272.

The disc part 273 may disperse downstream of the optical path of the first pre-pulse laser beam PP1 and the density of the target material therein may be relatively high. The dome part 272 may disperse upstream of the optical path of the first pre-pulse laser beam PP1 and the density of the target material therein may be relatively low. Inside of the dome part 272, a part 274 may be generated where the density of the target material is still lower.

As illustrated in FIG. 5B, the broken-up secondary target 271 may be irradiated with a second pre-pulse laser beam PP2. The second pre-pulse laser beam PP2 may have a focal diameter approximately equal to or a little larger than the diameter D2 of the broken-up secondary target 271. For example, the focal diameter may be 300 µm to 400 µm. The focal diameter does not need to be a spot diameter at the focal point. In other words, the pre-pulse laser beam PP2 may be emitted in a defocusing manner.

Figure 5C:
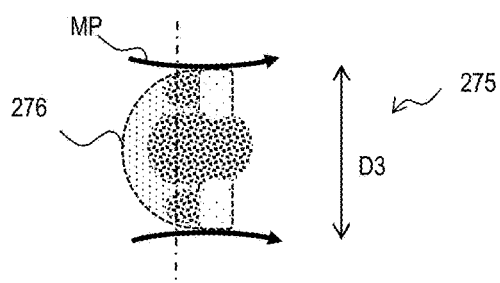
FIG. 5C schematically illustrates a state of a target when being irradiated with a main pulse laser beam.

FIG. 5C schematically illustrates a state of a target when being irradiated with a main pulse laser beam MP. When the secondary target 271 shown in FIG. 5B is irradiated with a second pre-pulse laser beam PP2, a tertiary target 275 including at least either vapor or pre-plasma 276 is generated.

As illustrated in FIG. 5C, the tertiary target 275 including at least either vapor or pre-plasma 276 may be irradiated with a main pulse laser beam MP. The main pulse laser beam MP may have a focal diameter approximately equal to or a little larger than the diameter D3 of the tertiary target 275. For example, the focal diameter may be 300 µm to 400 µm.

Figure 5D:
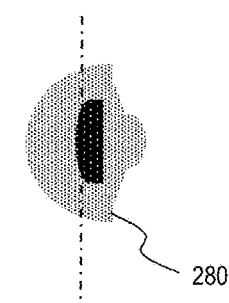
FIG. 5D schematically illustrates a state of a target after being irradiated with a main pulse laser beam.

FIG. 5D schematically illustrates a state of the target after being irradiated with a main pulse laser beam MP. When the tertiary target 275 shown in FIG. 5C is irradiated with a main pulse laser beam MP, the tertiary target 275 may turn into plasma; the plasma 280 may radiate EUV light.

5.3 Changes of Central Position of Target

Figure 6A:
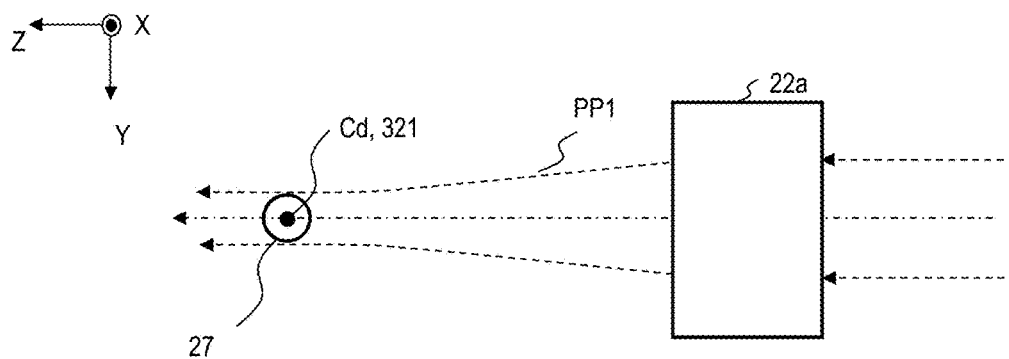
FIG. 6A illustrates a state immediately before a droplet is irradiated with a first pre-pulse laser beam.

FIGS. 6A to 6E illustrate that the central position of a target varies as the target is irradiated with a pulse laser beam. FIG. 6A illustrates a state immediately before a droplet 27 (primary target) is irradiated with the first pre-pulse laser beam PP1. The focal position 321 of the first pre-pulse laser beam PP1 may be substantially the same as the central position Cd (Xd, Yd, Zd) of the droplet.

Figure 6B:
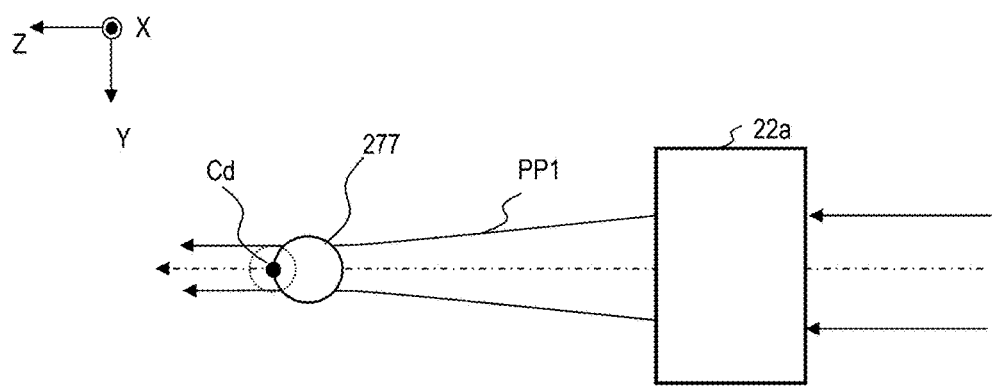
FIG. 6B illustrates a state immediately after a droplet is irradiated with a first pre-pulse laser beam.

FIG. 6B illustrates a state immediately after the droplet 27 is irradiated with the first pre-pulse laser beam PP1. Because of the irradiation with the first pre-pulse laser beam PP1, the droplet 27 may be ablated from the surface 277 irradiated with the pulse laser beam. The reaction to the ablation may apply propulsive force to the droplet 27 in the Z-direction or the traveling direction of the first pre-pulse laser beam PP1.

Figure 6C:
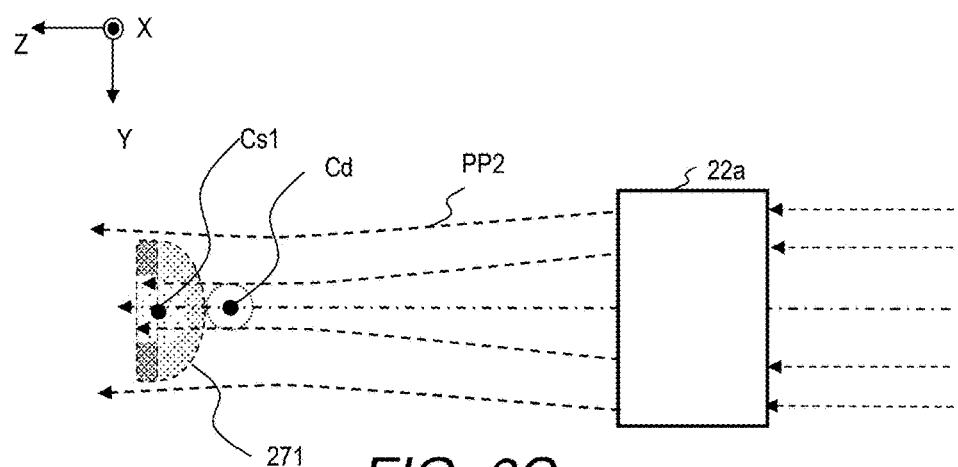
FIG. 6C illustrates a state immediately before a secondary target is irradiated with a second pre-pulse laser beam.

FIG. 6C illustrates a state immediately before a secondary target 271 is irradiated with the second pre-pulse laser beam PP2. The reaction to the ablation may change the droplet 27 to a secondary target 271 and disperse the secondary target 271. The central position Cs1 (Xs1, Ys1, Zs1) of the secondary target 271 may be the central position of the spatial distribution of the particles.

Since the secondary target 271 is generated from the droplet 27 traveling along the target trajectory 270, the secondary target 271 may hold the inertia force to travel in the Y-direction held by the droplet 27. Accordingly, the secondary target 271 may be subjected to the propulsive force in the Z-direction caused by the ablation and the inertia force in the Y-direction.

For this reason, the central position Cs1 of the secondary target 271 may move in the Z-direction and the Y-direction from the central position Cd of the droplet 27. The laser controller 55 may change the focal point of the second pre-pulse laser beam PP2 to substantially the same position as the shifted central position Cs1 of the secondary target 271.

Figure 6D:
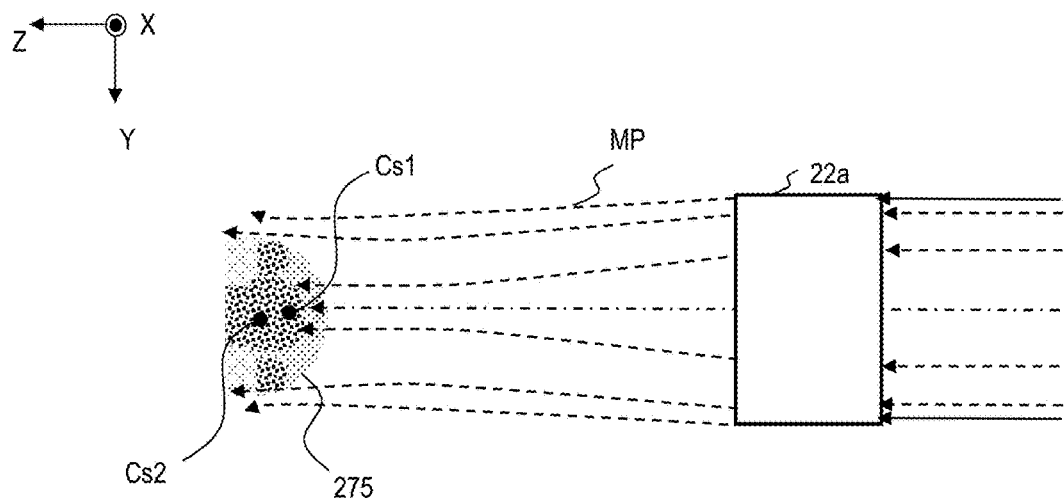
FIG. 6D illustrates a state immediately before a tertiary target is irradiated with a main pulse laser beam.

FIG. 6D illustrates a state immediately before the tertiary target 275 is irradiated with the main pulse laser beam MP. The central position Cs2 (Xs2, Ys2, Zs2) of the tertiary target 275 may be the central position of the spatial distribution of the particles.

The tertiary target 275 may be subjected to the propulsive force in the Z-direction caused by the ablation and the inertia force in the Y-direction. For this reason, the central position Cs2 of the tertiary target 275 may move in the Z-direction and the Y-direction from the central position Cs1 of the secondary target 271. The laser controller 55 may change the focal position of the main pulse laser beam MP to substantially the same position as the shifted central position Cs2 of the tertiary target 275.

Figure 6E:
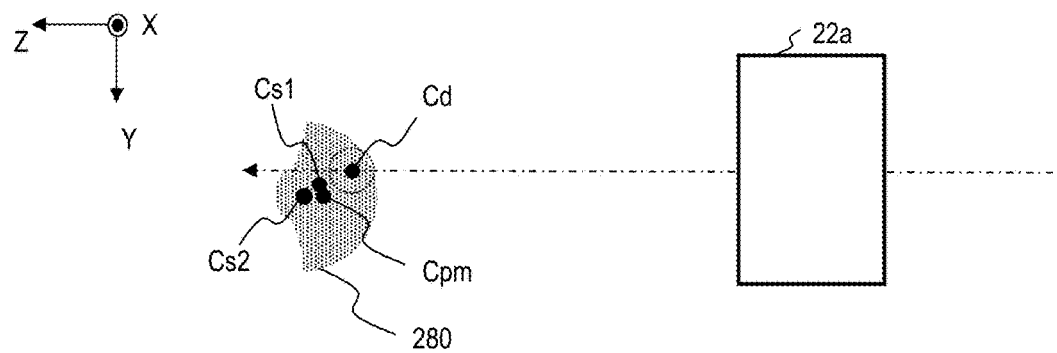
FIG. 6E illustrates a state immediately after a tertiary target is irradiated with a main pulse laser beam.

FIG. 6E illustrates a state immediately after the tertiary target 275 is irradiated with the main pulse laser beam MP. Because of the irradiation with the main pulse laser beam MP, the tertiary target 275 may turn into plasma to radiate plasma light 280. The central position Cpm (Xpm, Ypm, Zpm) of the plasma light 280 may be positioned on the irradiated surface of the tertiary target 275 or vicinity thereof. Accordingly, the center of the plasma light 280 may be shifted in the −Z-direction from the center Cs2 of the tertiary target 275.

5.4 Operation

The EUV light generation system 11 in the comparative example may take images showing the states of a target with the image measurement device 460 and control the target positions and the laser beam positions based on the image data. The laser controller 55 may irradiate a target at proper positions with pulse laser beams. Furthermore, the laser controller 55 may control the position of the plasma for radiating EUV light to the position specified by the exposure apparatus 6.

The laser controller 55 may retrieve a target central position Pct (Xpt, Ypt, Zpt) for the plasma light 280. The target central position Pct (Xpt, Ypt, Zpt) may be a target value for the central position of the plasma light radiated from the droplet immediately after being irradiated with the main pulse laser beam MP in the plasma generation region 25. The target central position Pct (Xpt, Ypt, Zpt) may be a value predetermined by the EUV light generation controller 5 based on an instruction from the exposure apparatus 6. The laser controller 55 may retrieve the target central position Pct (Xpt, Ypt, Zpt) stored in the EUV light generation controller 5.

The laser controller 55 may control the image measurement device 460 based on the passage timing signal PT to measure the droplet (primary target) 27, the secondary target 271, the tertiary target 275, and the plasma light 280 generated by irradiation of the tertiary target 275 with the main pulse laser beam MP at the plasma generation region 25.

Specifically, the laser controller 55 may locate the central position Cd (Xd, Yd, Zd) of the droplet immediately before irradiation with the first pre-pulse laser beam PP1, the central position Cs1 (Xs1, Ys1, Zs1) of the secondary target immediately before irradiation with the second pre-pulse laser beam PP2, the central position Cs2 (Xs2, Ys2, Zs2) of the tertiary target immediately before irradiation with the main pulse laser beam MP, and the central position Cpm (Xpm, Ypm, Zpm) of the plasma light immediately after irradiation of the tertiary target 275 with the main pulse laser MP.

The laser controller 55 may calculate the difference between the target central position Pct for the plasma light 280 and the located central position Cpm of the plasma light 280 generated immediately after irradiation with the main pulse laser beam MP. The laser controller 55 may perform the following control based on the calculation result.

The laser controller 55 may control the position of the droplet 27 by controlling the droplet ejection position and the droplet ejection timing of the target supply device 26. The laser controller 55 may control the focal position of the first pre-pulse laser beam PP1 by controlling the three-axis stage 226 of the laser beam focusing optical system 22a and the first beam adjustment device 304.

The laser controller 55 may control the focal position of the second pre-pulse laser beam PP2 by controlling the three-axis stage 226 of the laser beam focusing optical system 22a and the second beam adjustment device 305. The laser controller 55 may control the focal position of the main pulse laser beam MP by controlling the three-axis stage 226 of the laser beam focusing optical system 22a and the third beam adjustment device 306. Through such control by the laser controller 55, the central position Cpm of the plasma light generated by irradiation of the tertiary target 275 with the main pulse laser beam MP may get closer to the target central position Pct for the plasma light 280.

Figure 7:
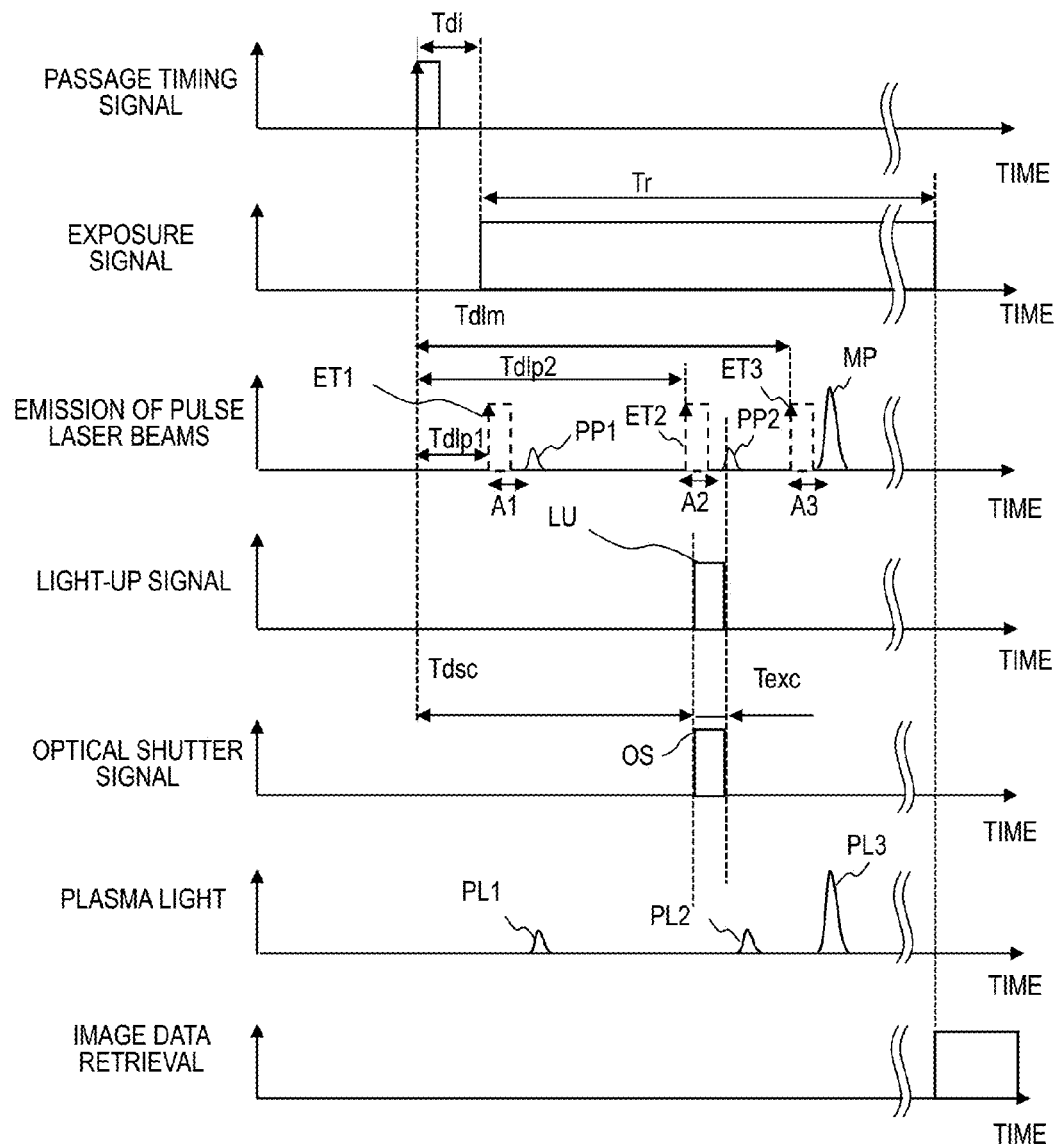
FIG. 7 is a time chart related to image measurement by a laser controller and particularly, image measurement on a secondary target immediately before being irradiated with a second pre-pulse laser beam.

FIG. 7 is a time chart related to image measurement by the laser controller 55 and particularly, image measurement on the secondary target 271 immediately before being irradiated with the second pre-pulse laser beam PP2. The laser controller 55 may control the output timing of the signals related to the image measurement as follows, based on the passage timing signal PT outputted from the timing sensor 450.

The laser controller 55 may control the target supply controller 51 to drive the target supply device 26 so that the target supply device 26 outputs a target 27. When the target 27 passes through a detection range of the timing sensor 450, the timing sensor 450 may output a passage timing signal PT to the laser controller 55.

In response to the passage timing signal PT, the laser controller 55 may output an exposure signal EX having a pulse width corresponding to an exposure time Tr to the image sensor 469 with a delay time Tdi. Upon receipt of the exposure signal EX, the image sensor 469 may expose itself until passage of the exposure time Tr. The delay time Tdi and the exposure time Tr may be predetermined.

The laser controller 55 that has received the passage timing signal PT may further output a first light emission trigger signal ET1 to the first pre-pulse laser apparatus 301 with a delay time Tdlp1. In response to the first light emission trigger signal ET1, the first pre-pulse laser apparatus 301 may emit a first pre-pulse laser beam PP1 to the plasma generation region 25 after passage of a time A1. The first pre-pulse laser beam PP1 may generate first plasma light PL1 having low intensity.

The laser controller 55 that has received the passage timing signal PT may further output a second light emission trigger signal ET2 to the second pre-pulse laser apparatus 302 with a delay time Tdlp2. In response to the second light emission trigger signal ET2, the second pre-pulse laser apparatus 302 may emit a second pre-pulse laser beam PP2 to the plasma generation region 25 after passage of a time A2. The second pre-pulse laser beam PP2 may generate second plasma light PL2 having low intensity.

The laser controller 55 that has received the passage timing signal PT may further output a third light emission trigger signal ET3 to the main pulse laser apparatus 303 with a delay time Tdlm. In response to the third light emission trigger signal ET3, the main pulse laser apparatus 303 may emit a main pulse laser beam MP to the plasma generation region 25 after passage of a time A3. The main pulse laser beam MP may generate third plasma light PL3, which may generate EUV light.

The laser controller 55 that has received the passage timing signal PT may further output an optical shutter signal OS having a pulse width corresponding to a shutter open time Texc to the shutter 468 with a delay time Tdsc. The shutter 468 may be open upon receipt of the optical shutter signal OS until passage of the shutter open time Texc.

The laser controller 55 may output a light-up signal LU having a pulse width corresponding to the shutter open time Texc to the light source 462 simultaneously with the optical shutter signal OS. The light source 462 may emit pulse light upon receipt of the light-up signal LU until passage of the shutter open time Texc.

The time for the imaging unit 465 to take an image may be set to a time immediately before the secondary target 271 is irradiated with the second pre-pulse laser beam PP2. Specifically, the sum Tdsc+Texc of the delay time Tdsc for specifying the time to output the optical shutter signal OS and the shutter open time Texc may be equal to or shorter than the sum Tdlp2+A2 of the delay time Tdlp2 and the time A2 for specifying the time to emit the second pre-pulse laser beam PP2.

The imaging unit 465 may take an image of the secondary target 271 immediately before being irradiated with the second pre-pulse laser beam PP2. The second plasma light PL2 may be radiated after the shutter 468 is opened and the shutter open time Texc has passed.

Figure 8:
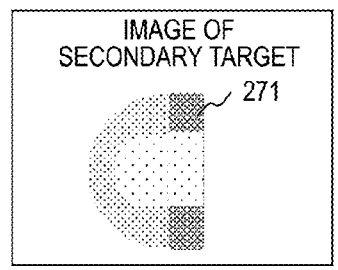
FIG. 8 shows an image of a secondary target.

The image sensor 469 may create image data IM and output the image data IM to the laser controller 55 after the exposure time Tr has passed. The laser controller 55 may acquire the image data IM of the secondary target 271 immediately before being irradiated with the second pre-pulse laser beam PP2. The image of the secondary target 271 immediately before being irradiated with the second pre-pulse laser beam PP2 may be an image shown in FIG. 8, for example. The laser controller 55 may change the timing control for the image measurement device 460 to acquire the image data of the primary target 27 and the tertiary target 275, like the secondary target 271.

5.5 Issue on Comparative Example

The EUV light energy may vary, even if the target is irradiated at proper positions with the pulse laser beams. The inventors found that the mist dispersion velocity of the secondary target 271 varies depending on the fluence of the first pre-pulse laser beam PP1.

Figure 9:
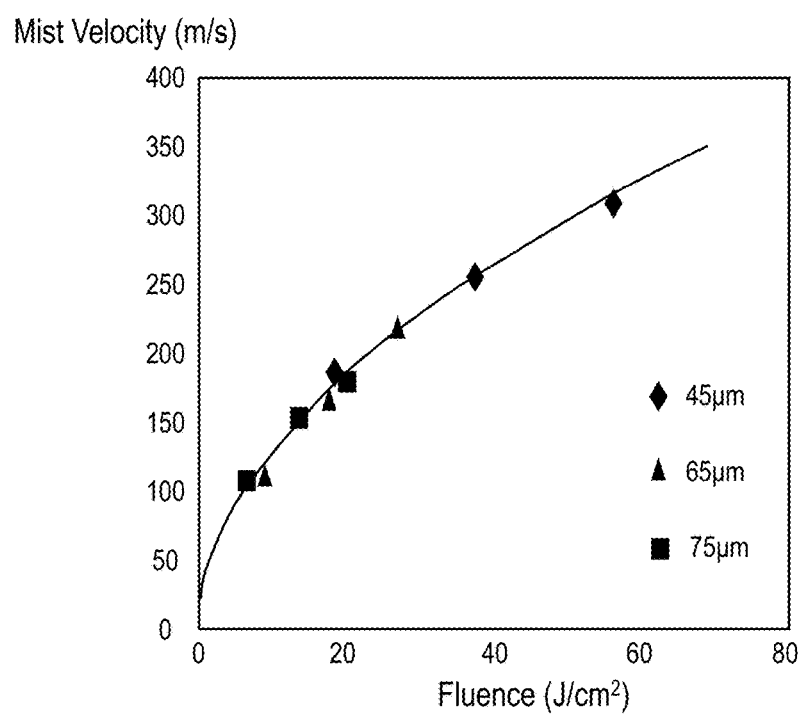
FIG. 9 is a graph of the mist dispersion velocity versus the fluence of the first pre-pulse laser beam provided to a droplet.

FIG. 9 is a graph of the mist dispersion velocity versus the fluence of the first pre-pulse laser beam PP1 provided to a droplet 27. FIG. 9 indicates that, when the fluence of the first pre-pulse laser beam PP1 varies, the mist dispersion velocity varies, regardless of the focal diameter of the laser beam. FIG. 9 shows measurement results in the cases of laser beams having focal diameters of 45 μm, 65 μm, and 75 μm.

If the mist dispersion velocity varies among mist targets, the mist diameter at a common time point may vary. If the mist diameter varies, the manner of the dispersion caused by the second pre-pulse laser beam PP2 may vary among the tertiary targets 275, so that absorption of the main pulse laser beam MP may vary among the tertiary target 275. As a result, the efficiency of generation of EUV light may vary so that the EUV light energy may become unstable. That is to say, if the fluence of the first pre-pulse laser beam PP1 varies, the EUV light energy may become unstable.

6. EMBODIMENT 1

Figure 10:
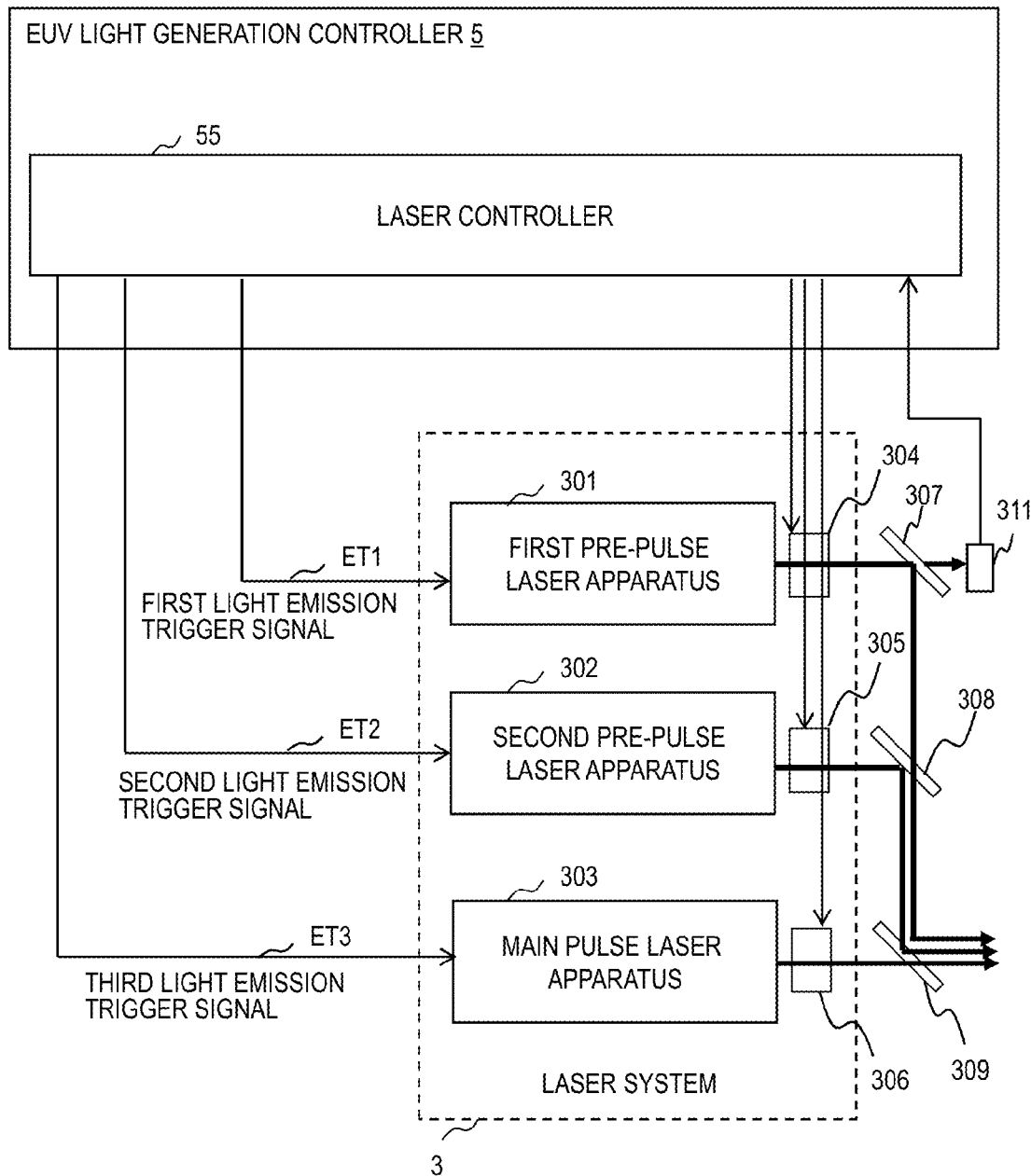
FIG. 10 illustrates a partial configuration example of an EUV light generation system in Embodiment 1.

FIG. 10 illustrates a partial configuration example of an EUV light generation system 11 in Embodiment 1. Unlike the comparative example shown in FIG. 4, the EUV light generation system 11 may include an energy sensor 311 for detecting the energy of the first pre-pulse laser beam PP1. The energy sensor 311 may detect the energy of a small amount of first pre-pulse laser beam PP1 that has passed through the high-reflecting mirror 307. The energy sensor 311 may be connected with the laser controller 55 and output the measured value of the energy of the first pre-pulse laser beam PP1 to the laser controller 55.

The laser controller 55 may output a first light emission trigger signal ET1 to the first pre-pulse laser apparatus 301 based on the value measured by the energy sensor 311 so that the output energy of the first pre-pulse laser apparatus 301 will be uniform.

The present embodiment may prevent the variation in energy of the first pre-pulse laser beam PP1. Since the variation in fluence of the first pre-pulse laser beam PP1 depends on the variation in energy, the present embodiment may prevent the variation in fluence of the first pre-pulse laser beam PP1. As a result, the variation in dispersion velocity among mist targets may be prevented and further, the variation in EUV light energy may be prevented.

7. EMBODIMENT 2

7.1 Overview

The EUV light generation system 11 in the present embodiment may measure the mist diameters of the secondary targets 271 and control the energy of the first pre-pulse laser beam PP1 based on the measured mist diameters. This control may keep the mist diameters of the secondary targets 271 to be irradiated with the second pre-pulse laser beam PP2 substantially uniform and further, keep the EUV light energy substantially uniform.

7.2 Operation

Figure 11:
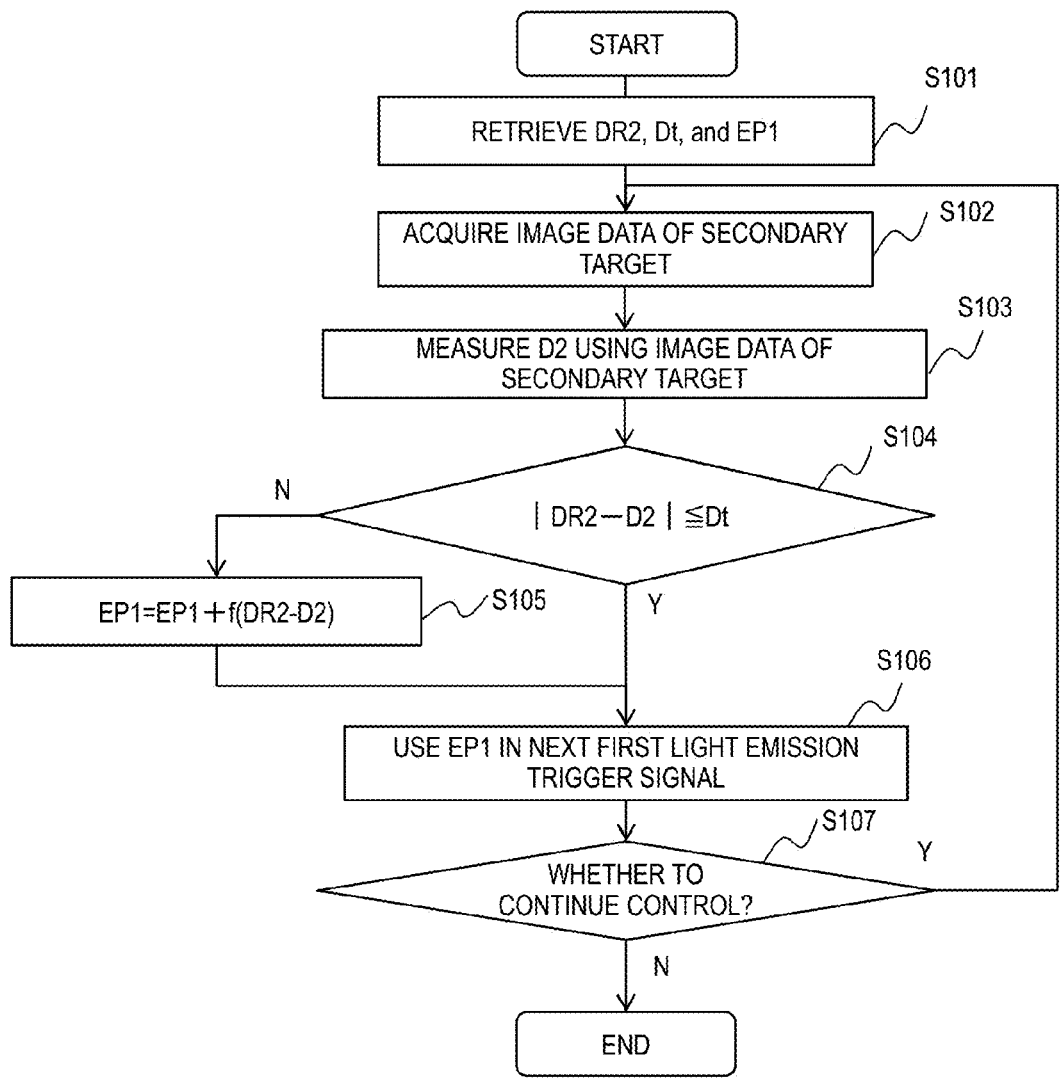
FIG. 11 is a flowchart of operation of a laser controller in Embodiment 2.

Hereinafter, operation in the present embodiment is specifically described. The configuration of the EUV light generation system 11 in the present embodiment may be the configuration shown in FIGS. 1 to 4. FIG. 11 is a flowchart of the operation of the laser controller 55 in the present embodiment. The laser controller 55 may retrieve a reference mist diameter DR2, an acceptable range Dt, and a first pre-pulse energy EP1 (S101). These values of DR2, Dt, and EP1 may be inputted by an operator or may be held in advance in the EUV light generation controller 5.

Figure 12:
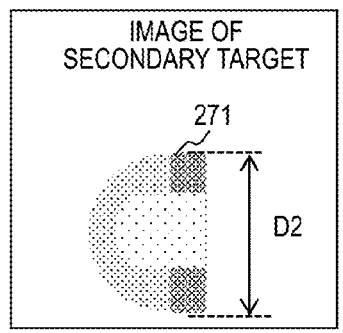
FIG. 12 illustrates a mist diameter D2 in an image of a secondary target in Embodiment 2.

The laser controller 55 may acquire image data of a secondary target 271 from the image measurement device 460 (S102) and measure the mist diameter D2 of the secondary target 271 using the image data of the secondary target 271 (S103). FIG. 12 illustrates the mist diameter D2 in the image of a secondary target 271.

The laser controller 55 may determine whether the absolute value of the difference between the measured mist diameter D2 and the reference mist diameter DR2 is within the acceptable range Dt (S104). If the absolute value of the difference between the measured mist diameter D2 and the reference mist diameter DR2 is within the acceptable range Dt (S104: Y), the laser controller 55 may use the current first pre-pulse energy EP1 in the next first light emission trigger signal ET1 without changing the first pre-pulse energy EP1 (S106).

If the absolute value of the difference between the measured mist diameter D2 and the reference mist diameter DR2 is out of the acceptable range Dt (S104: N), the laser controller 55 may correct the first pre-pulse energy EP1 based on the measured mist diameter D2 and the reference mist diameter DR2. Specifically, the laser controller 55 may calculate a new first pre-pulse energy EP1 in accordance with the following formula (S105):

$$EP1=EP1+f(DR2-D2),$$

where the function f may be predefined based on the experimental data like the one shown in FIG. 9.

The laser controller 55 may use the corrected first pre-pulse energy EP1 in the next first light emission trigger signal ET1 (S106). At Step S106, the laser controller 55 may use the determined first pre-pulse energy EP1 in one of the next and the subsequent first light emission trigger signals ET1.

The laser controller 55 may determine whether to continue the control of the first pre-pulse energy EP1 based on the burst signal BT (S107). If the determination is to continue the control of the first pre-pulse energy EP1 (S107: Y), the laser controller 55 may return to Step S101. If the determination is not to continue the control of the first pre-pulse energy EP1 (S107: N), the laser controller 55 may terminate this processing.

7.3 Effects

The present embodiment may prevent the variation in mist diameter among the secondary targets 271 to be irradiated with the second pre-pulse laser beam PP2 and further, prevent the variation in EUV light energy through feedback control of the pulse energy of the first pre-pulse laser beam PP1 in accordance with the measured mist diameters of the secondary targets 271.

8. EMBODIMENT 3

8.1 Second Issue on Comparative Example

The inventors found that the mist dispersion velocity of a secondary target 271 varies within a burst depending on the number of pulses from the beginning of the burst. In one burst period, the laser system 3 may emit predetermined numbers of pulses of the first pre-pulse laser beam PP1, the second pre-pulse laser beam PP2, and the main pulse laser beam MP at predetermined cyclic frequencies.

Figure 13:
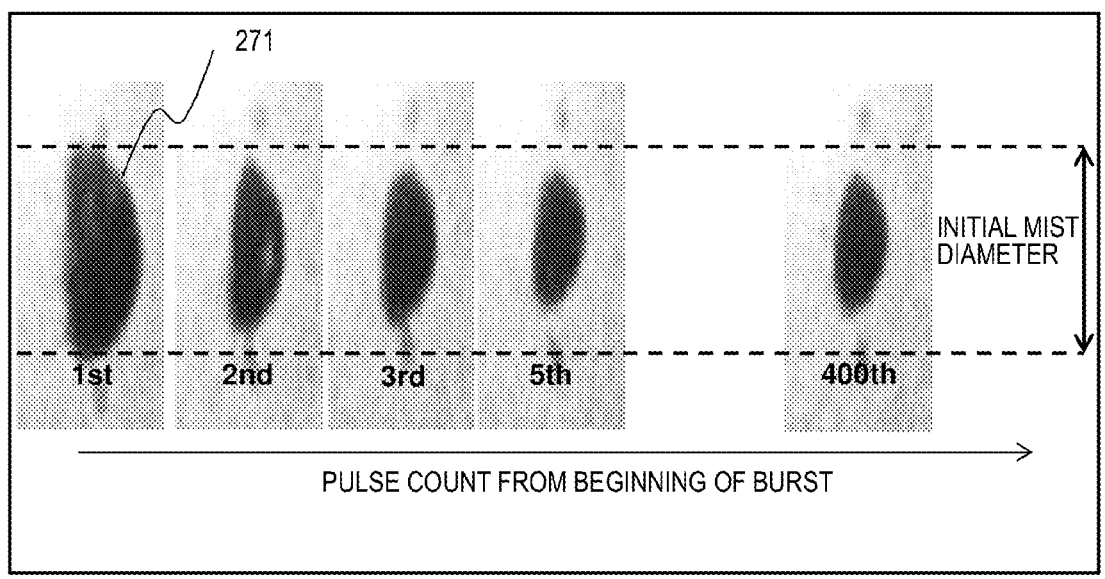
FIG. 13 shows an experiment result about the relation between the pulse count of the first pre-pulse laser beam from the beginning of a burst and the mist diameter of the secondary target in Embodiment 3.

FIG. 13 shows an experiment result about the relation between the pulse count of the first pre-pulse laser beam PP1 from the beginning of a burst and the mist diameter of the secondary target 271. FIG. 13 shows the mist diameter of a secondary target 271 when an equal time has passed after emission of the first pre-pulse laser beam PP1, at each of the pulses of the first pre-pulse laser beam PP1. FIG. 13 indicates that the mist diameter significantly decreases and then gradually becomes stable at substantially the same value as the pulse count increases from the beginning of a burst.

The decrease in mist diameter measured at a common time after emission of the first pre-pulse laser beam PP1 may mean that the dispersion velocity of the mist decreases with the pulse count in the burst. This may be presumed to be because the plasma generating EUV light affects the droplet to be irradiated next to be displaced. If the mist diameter of a secondary target 271 irradiated with the second pre-pulse laser beam PP2 varies with the pulse count in a burst, the EUV light energy may vary.

8.2 Overview

The EUV light generation system 11 in the present embodiment may measure the variation in mist diameter of a secondary target 271 with respect to the pulse count of the first pre-pulse laser beam PP1 in one or more bursts. These bursts may be called learning bursts. The EUV light generation system 11 may store the measurement results to the memory of the EUV light generation controller 5. The EUV light generation system 11 may output the pulses of the first pre-pulse laser beam PP1 in the next and subsequent bursts at the pulse energies determined based on the measurement results. The next and subsequent bursts may be called exposure bursts. The EUV light generation system 11 may determine the energy of the Nth pulse in an exposure burst based on the measurement results of the Nth pulses in the learning bursts.

Figure 14A:
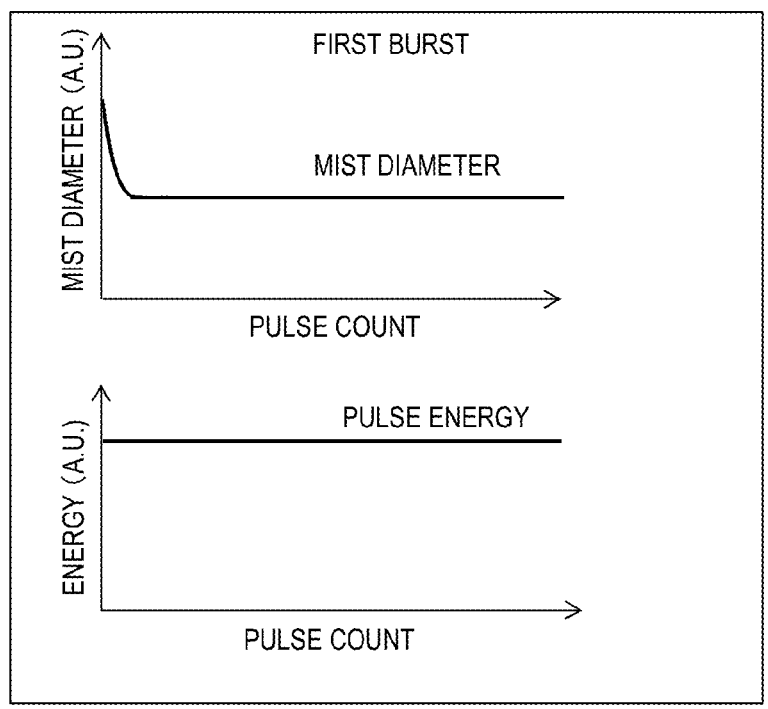
FIG. 14A schematically shows measurement results of the mist diameter of a secondary target with respect to the pulse count of the first pre-pulse laser beam in the first burst in Embodiment 3.

FIG. 14A schematically shows the measurement results of the mist diameter of a secondary target 271 with respect to the pulse count of the first pre-pulse laser beam PP1 in the first burst being a learning burst. In the first burst, the energies of all the pulses of the first pre-pulse laser beam PP1 may be uniform. The mist diameter may gradually decrease from the first pulse and be substantially the same from a certain pulse.

Figure 14B:
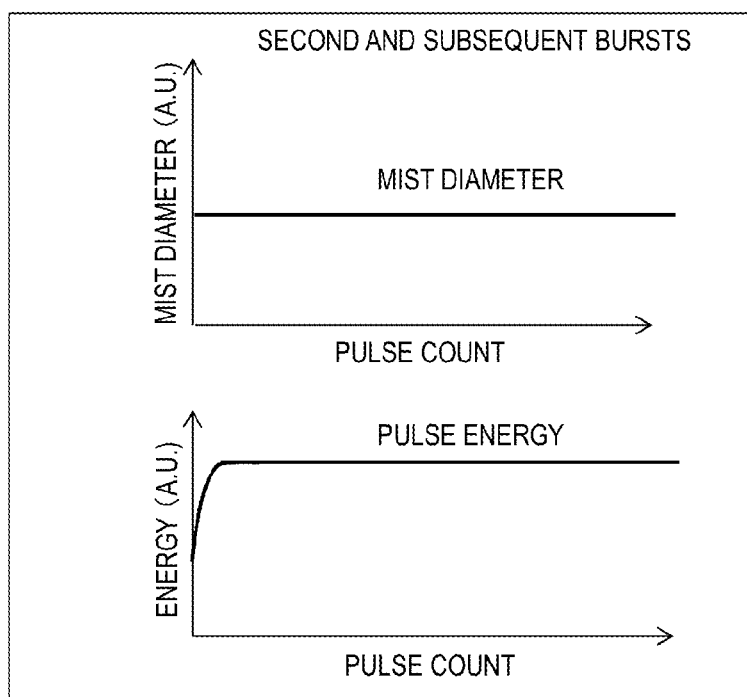
FIG. 14B schematically shows the variation in mist diameter and the variation in pulse energy in the second and subsequent bursts in Embodiment 3.

The EUV light generation system 11 may control the energy of the first pre-pulse laser beam PP1 in the next and subsequent exposure bursts based on the measurement results stored in the memory. FIG. 14B schematically shows the variation in mist diameter and the variation in pulse energy in the second and subsequent bursts. As to the first pre-pulse laser beam PP1, the EUV light generation system 11 may gradually increase the pulse energy from the first pulse and keep the pulse energy uniform from a specific pulse.

Through the above-described pulse energy control for the first pre-pulse laser beam PP1, the mist diameter of a secondary target 271 to be irradiated with the second pre-pulse laser beam PP2 may be maintained at substantially the same size to achieve substantially uniform EUV light energy.

8.3 Operation

Figure 15:
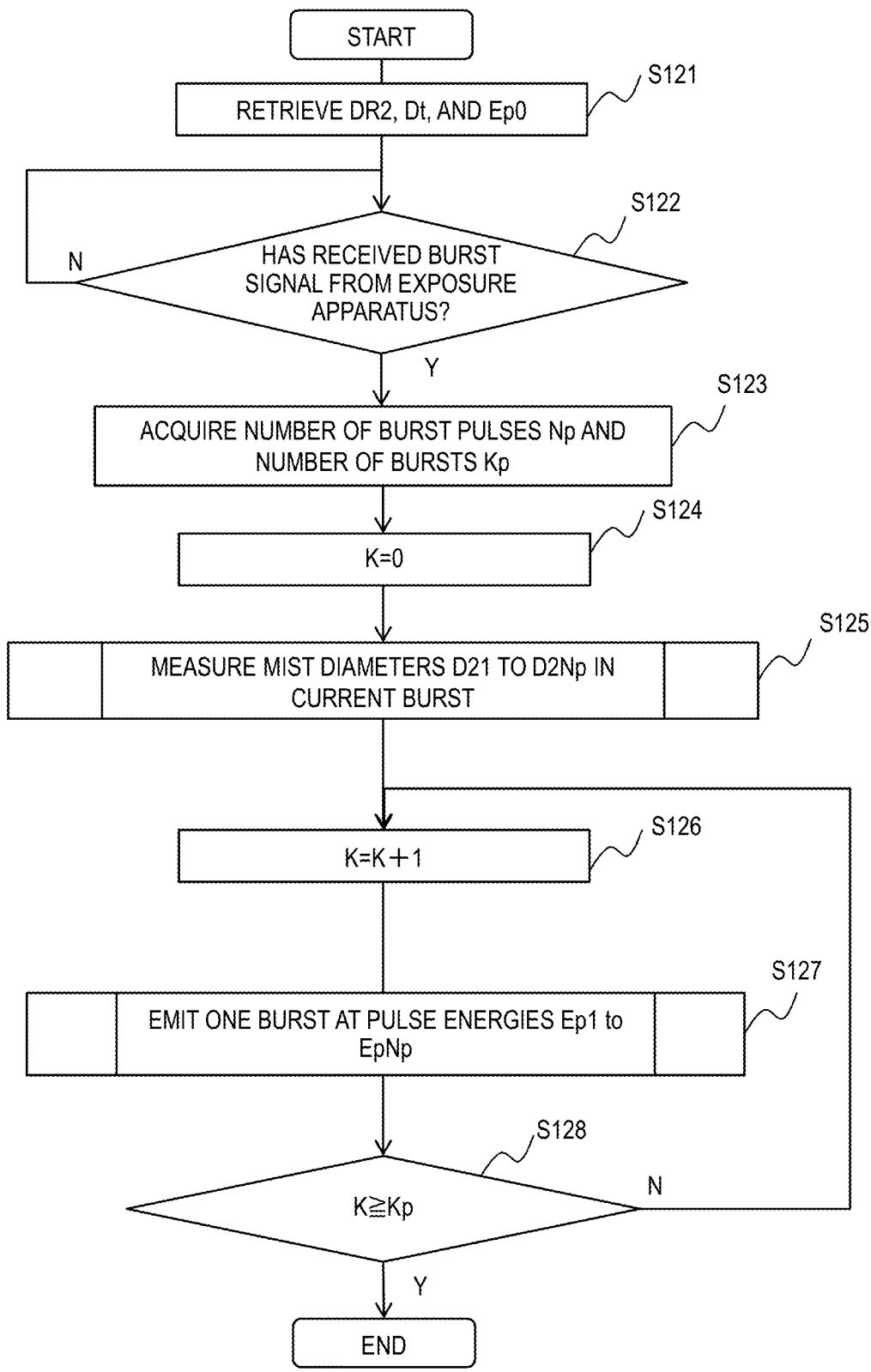
FIG. 15 is a flowchart of operation of a laser controller in Embodiment 3.

Hereinafter, operation in the present embodiment is specifically described. The configuration of the EUV light generation system 11 in the present embodiment may be the configuration shown in FIGS. 1 to 4. FIG. 15 is a flowchart of the operation of the laser controller 55 in the present embodiment.

First, the laser controller 55 may retrieve a reference mist diameter DR2, an acceptable range Dt, and a pulse energy Ep0 (S121). These values of DR2, Dt, and Ep0 may be inputted by an operator or may be held in advance in the EUV light generation controller 5.

Next, the laser controller 55 may determine whether the laser controller 55 has received a burst signal BT from the exposure apparatus 6 (S122). If the laser controller 55 has not received a burst signal BT from the exposure apparatus 6 (S122: N), the laser controller 55 may repeat Step S122.

If the laser controller 55 has received a burst signal BT from the exposure apparatus 6 (S122: Y), the laser controller 55 may acquire a number of burst pulses Np and a number of bursts Kp (S123). The number of burst pulses Np is the number of pulses of the first pre-pulse laser beam PP1 to be included in each burst. The number of bursts Kp is the number of bursts to be generated in the current exposure processing. The laser controller 55 may hold the values of the number of burst pulses Np and the number of bursts Kp in advance or acquire the values from the burst signal BT.

Next, the laser controller 55 may substitute 0 for a variable K (S124). The variable K represents the number of bursts already generated. Next, the laser controller 55 may measure the mist diameters D21 to D2Np of the secondary target 271 (S125). The mist diameter D2N is the mist diameter of a secondary target 271 at the Nth pulse in a burst and N is an integer of one of 1 to Np.

Next, the laser controller 55 may add 1 to the variable K (S126). The laser controller 55 may emit a burst of first pre-pulse laser beam PP1 at pulse energies Ep1 to EpNp (S127). The pulse energy EpN represents the energy of the Nth pulse in a burst and N is an integer of one of 1 to Np. The pulse energy EpN may be calculated based on the mist diameter D2N.

Next, the laser controller 55 may determine whether the variable K has reached the number of bursts Kp (S128). If the variable K has not reached the number of bursts Kp (S128: N), the laser controller 55 may return to Step S126. If the variable K has reached the number of bursts Kp (S128: Y), the laser controller 55 may terminate this processing.

Figure 16:
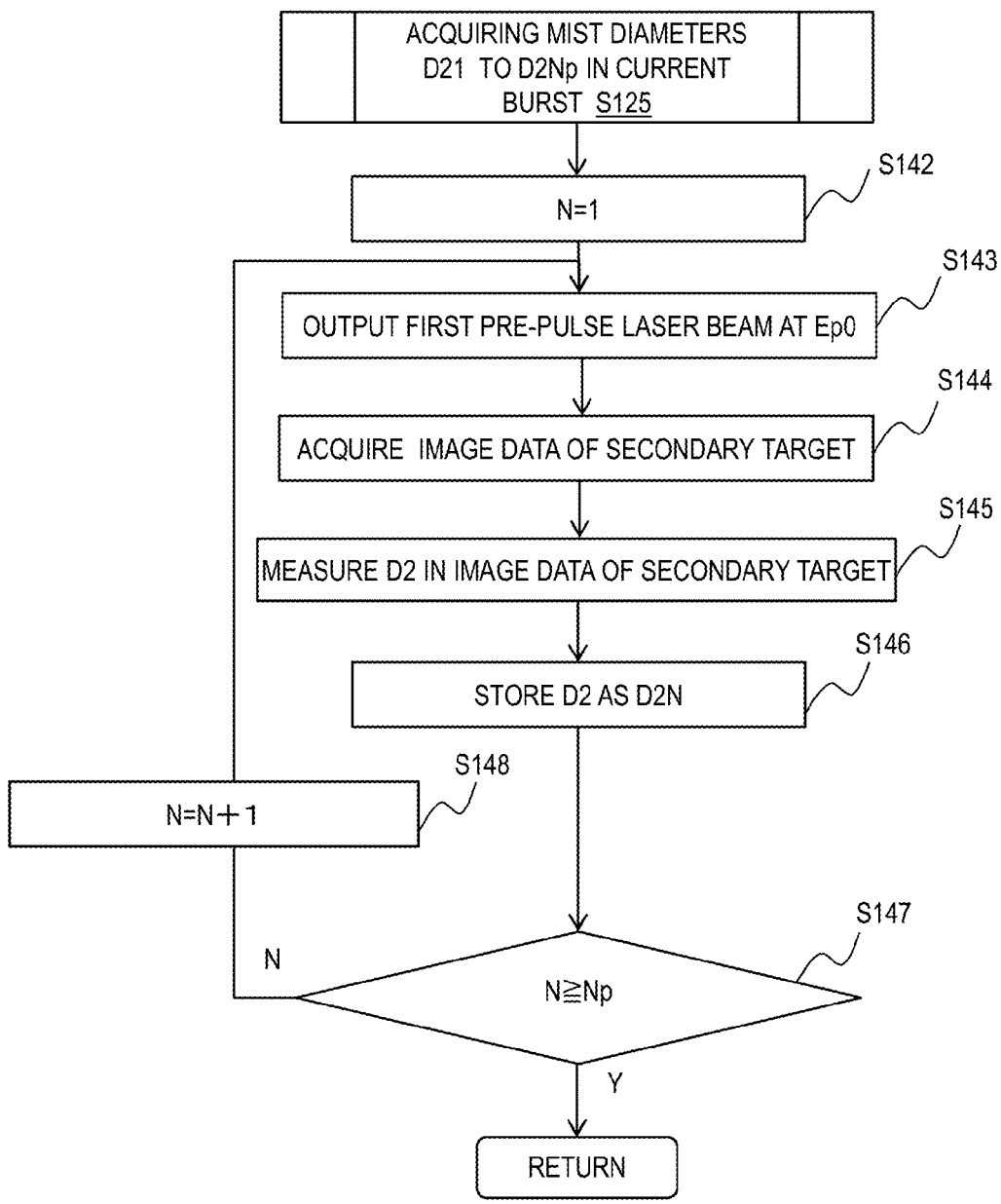
FIG. 16 is a detailed flowchart of Step S125 in FIG. 15.

FIG. 16 is a detailed flowchart of Step 125 in FIG. 15. In the first burst, the laser controller 55 may emit pulses of the first pre-pulse laser beam PP1 at a uniform pulse energy, measure the mist diameter at each pulse, and store the measurement result with the pulse count to the memory.

Specifically, the laser controller 55 may substitute 1 for a variable N (S142). The variable N represents the pulse count for the next pulse in the burst. Next, the laser controller 55 may make the first pre-pulse laser apparatus 301 output a pulse of the first pre-pulse laser beam PP1 at a pulse energy Ep0 (S143). Next, the laser controller 55 may acquire image data of the secondary target 271 from the image measurement device 460 (S144).

Next, the laser controller 55 may measure the mist diameter D2 of the secondary target 271 in the image data of the secondary target 271 (S145). Next, the laser controller 55 may store the measured mist diameter D2 to the memory as the measured mist diameter D2N at the Nth pulse (S146).

Next, the laser controller 55 may determine whether the variable N has reached the number of burst pulses Np (S147). If the variable N has not reached the number of burst pulses Np (S147: N), the laser controller 55 may add 1 to the variable N (S148) and return to Step S143. If the variable N has reached the number of burst pulses Np (S147: Y), the laser controller 55 may return to the processing in FIG. 15.

Figure 17:
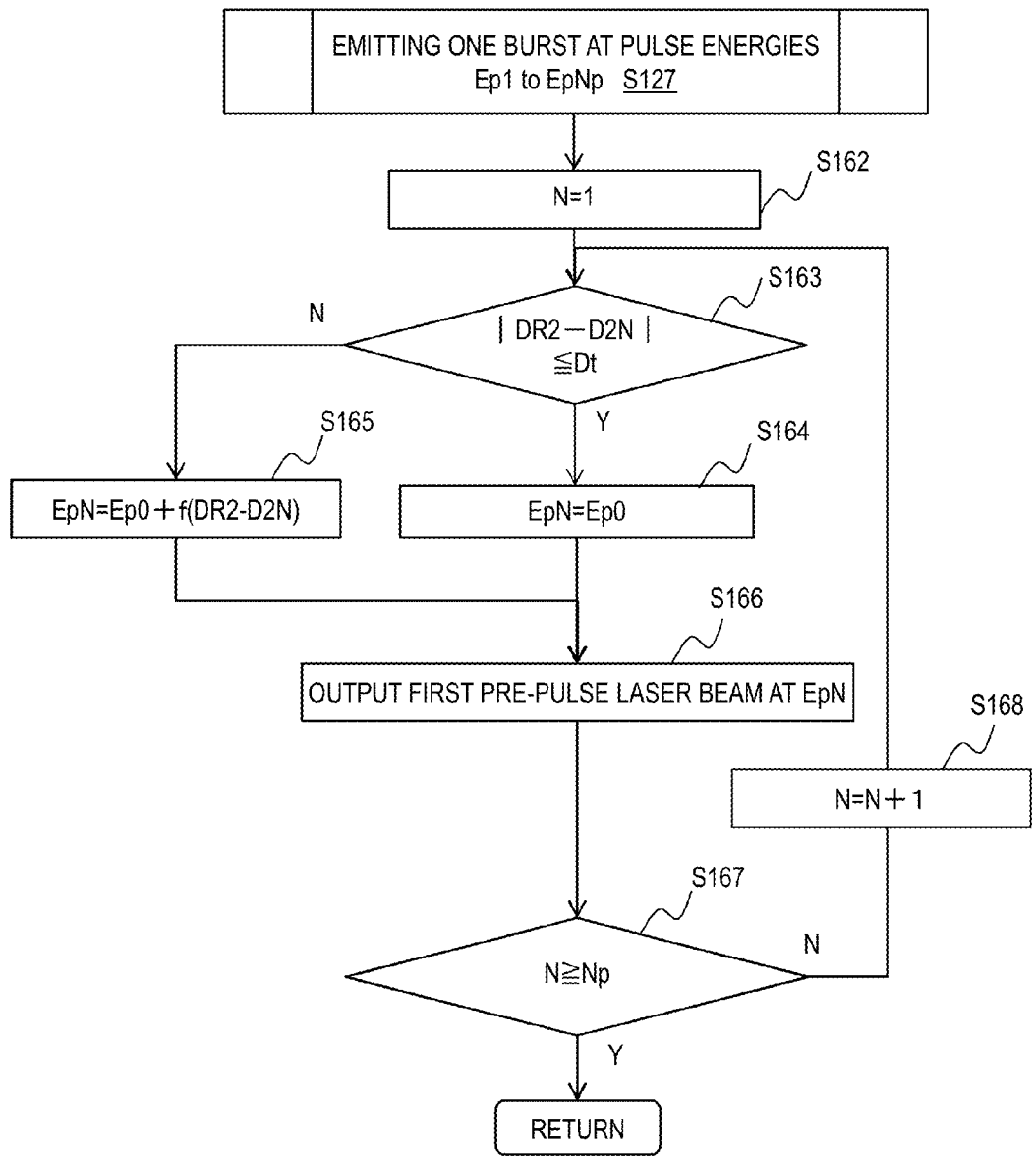
FIG. 17 is a detailed flowchart of Step S127 in FIG. 15.

FIG. 17 is a detailed flowchart of Step S127 in FIG. 15. The laser controller 55 may calculate the energies of the individual pulses of the first pre-pulse laser beam in the burst based on the measured mist diameters stored in the memory and irradiate a primary target 27 with pulses having the calculated energies.

Specifically, the laser controller 55 may substitute 1 for a variable N (S162). The variable N represents the pulse count in the burst. Next, the laser controller 55 may determine whether the absolute value of the difference between the measured mist diameter D2N and the reference mist diameter DR2 is within the acceptable range Dt (S163).

If the absolute value of the difference between the measured mist diameter D2N and the reference mist diameter DR2 is within the acceptable range Dt (S163: Y), the laser controller 55 may determine the energy EpN at the Nth pulse to be the energy Ep0 used in the measurement of the mist diameters at S125 (S164).

If the absolute value of the difference between the measured mist diameter D2N and the reference mist diameter DR2 is out of the acceptable range Dt (S163: N), the laser controller 55 may determine the pulse energy EpN based on the measured mist diameter D2N and the reference mist diameter DR2. Specifically, the laser controller 55 may calculate the pulse energy EpN in accordance with the following formula:

$$EpN=Ep0+f(D2N-DR2),$$

where the function f may be predefined like in Embodiment 2.

Next, the laser controller 55 may make the first pre-pulse laser apparatus 301 emit the Nth pulse at the determined pulse energy EpN (S166). Next, the laser controller 55 may determine whether the variable N has reached the number of burst pulses Np (S167). If the variable N has not reached the number of burst pulses Np (S167: N), the laser controller 55 may The present embodiment may control the pulse energy of the first pre-pulse laser beam PP1 in accordance with the variation in mist diameter of the secondary target 271 in a burst to prevent the variation in mist diameter of a secondary target 271 to be irradiated with the second pre-pulse laser beam PP2 and further, the variation in EUV light energy.

8.4 Effects

The first burst to measure the mist diameters of a secondary target 271 does not need to be used in exposure. For example, the EUV light generation system 11 may include a shutter in an EUV light output unit and the shutter may be closed during the first burst.

9. EMBODIMENT 4

9.1 Overview

The EUV light generation system 11 in the present embodiment may switch the control of the pulse energy of the first pre-pulse laser beam PP1 from first pulse energy control to second pulse energy control in accordance with the number of pulses outputted in the burst. The first pulse energy control and the second pulse energy control may use different methods.

The EUV light generation system 11 may generate a learning burst that is not used for exposure, before exposure. In the learning burst, the EUV light generation system 11 may emit a predetermined number of pulses of the first pre-pulse laser beam PP1 at a uniform pulse energy and measure the mist diameter of a secondary target 271. The measurement results may be stored to the memory of the EUV light generation controller 5.

Figure 18A:
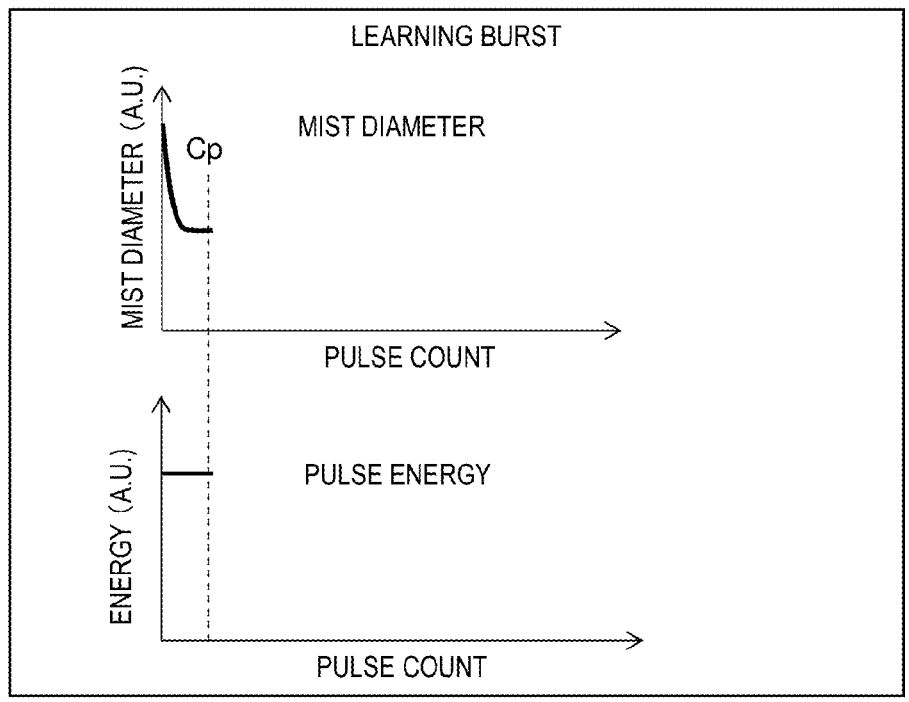
FIG. 18A schematically shows measurement results of the mist diameter of a secondary target with respect to the pulse count of the first pre-pulse laser beam in a learning burst in Embodiment 4.

FIG. 18A schematically shows measurement results of the mist diameter of a secondary target 271 with respect to the pulse count of the first pre-pulse laser beam PP1. FIG. 18A shows the measurement results of the mist diameter at the first pulse to the Cp-th pulse. The measurement results may show large decrease from the first pulse and small variation from a certain pulse prior to the Cp-th pulse.

The EUV light generation system 11 may determine pulse energies from the first pulse to the Cp-th pulse based on the mist diameters at the first pulse to the Cp-th pulse. The pulse count Cp may be the pulse count to switch from the first pulse energy control to the second pulse energy control. The value of Cp may be predetermined to be 30, for example.

Figure 18B:
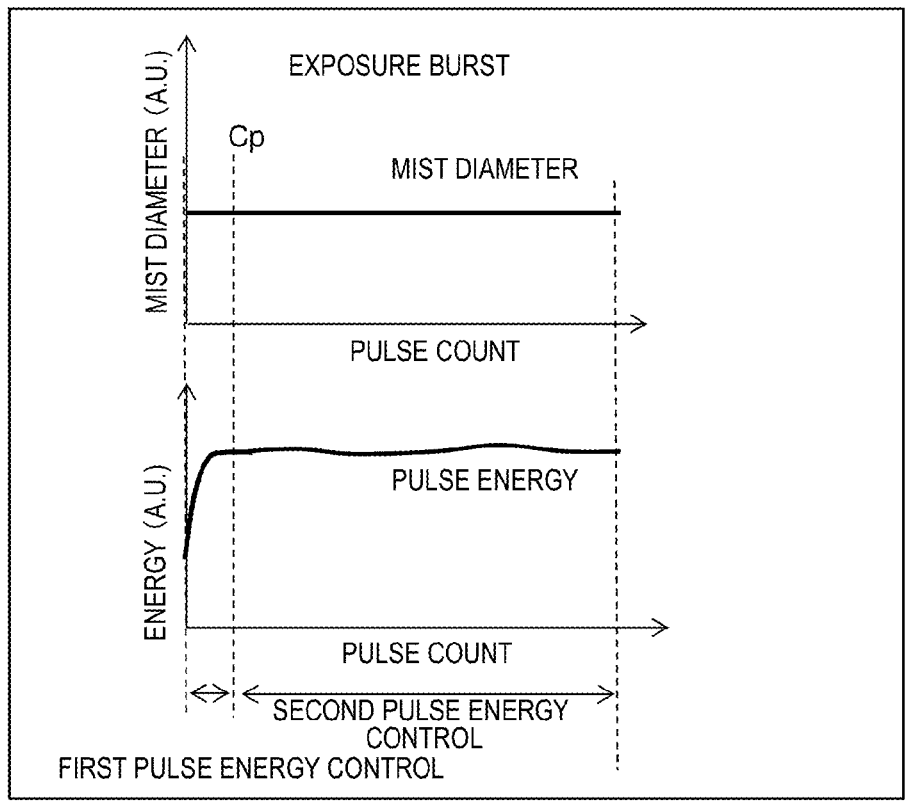
FIG. 18B schematically shows the variation in mist diameter and the variation in pulse energy in an exposure burst subsequent to the learning burst in Embodiment 4.

FIG. 18B schematically shows variation in mist diameter and variation in pulse energy in an exposure burst subsequent to the learning burst. The EUV light generation system 11 may perform pulse energy control based on the measurement results in the learning burst from the first pulse to the Cp-th pulse. At the pulses subsequent to the Cp-th pulse, the EUV light generation system 11 may perform the pulse energy control described in Embodiment 2.

The above-described switching of pulse energy control methods within a burst may prevent the variation in mist diameter of a secondary target 271 and the variation in EUV light energy caused thereby more appropriately.

The number of learning bursts may be one. The EUV light generation system 11 may determine the pulse energies from the first pulse to the Cp-th pulse of the burst based on the average of the mist diameters in a plurality of learning bursts. In the case of a plurality of learning bursts, the EUV light generation system 11 may measure the mist diameter at different pulse counts among the plurality of learning bursts. These may be applicable to Embodiment 3.

9.2 Operation

Figure 19:
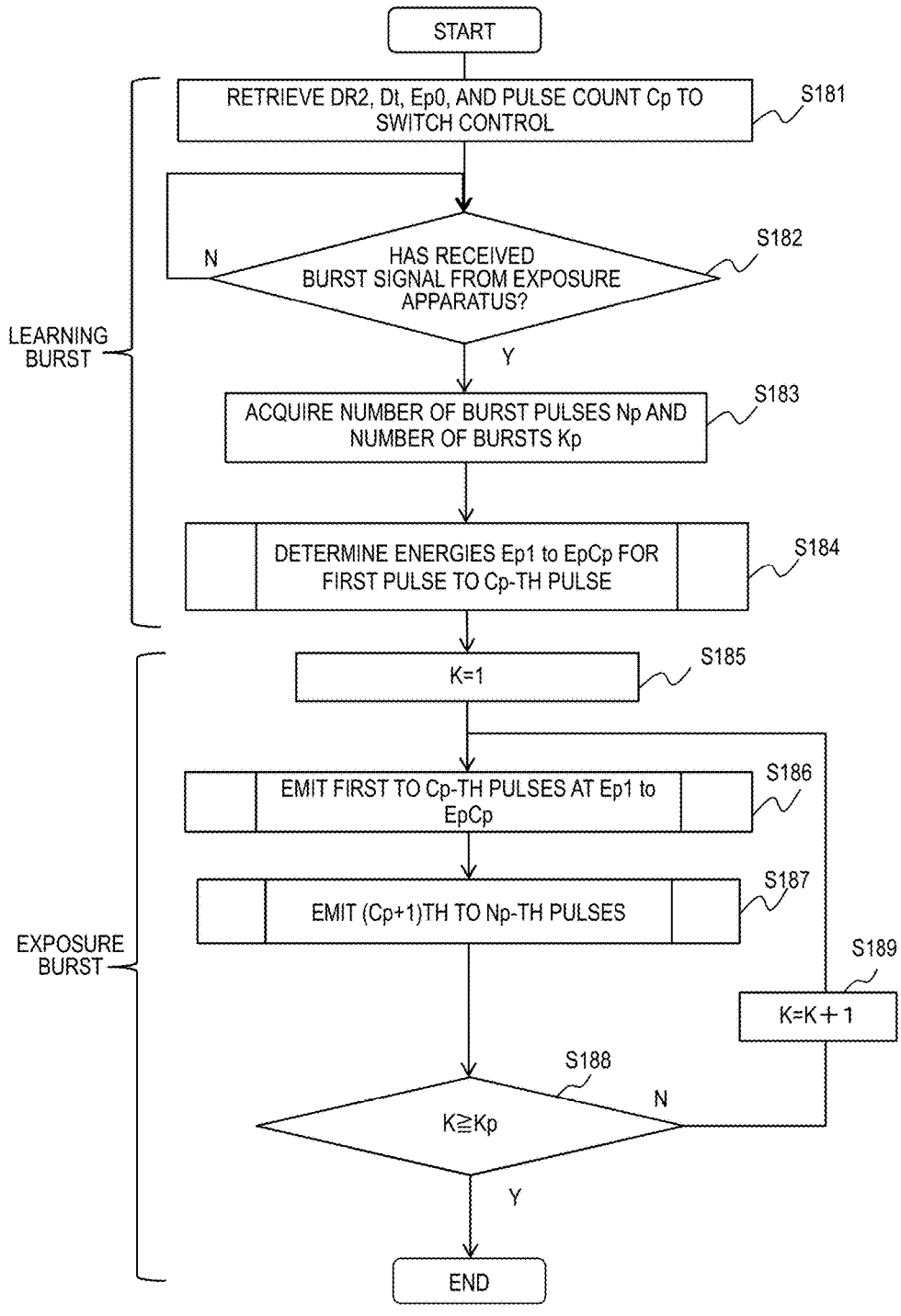
FIG. 19 is a flowchart of operation of a laser controller in Embodiment 4.

Hereinafter, operation in the present embodiment is specifically described. The configuration of the EUV light generation system 11 in the present embodiment may be the configuration shown in FIGS. 1 to 4. FIG. 19 is a flowchart of the operation of the laser controller 55 in the present embodiment. The laser controller 55 may perform the same pulse energy control as the control in Embodiment 3 from the first pulse to the Cp-th pulse and perform the same pulse energy control as the control in Embodiment 2 in the (Cp+1)th and the subsequent pulses.

First, the laser controller 55 may start a learning burst. The laser controller 55 may retrieve a reference mist diameter DR2, an acceptable range Dt, a pulse energy Ep0, and a pulse count Cp to switch the control (S181). These values of DR2, Dt, Ep0, and Cp may be inputted by an operator or may be held in advance in the EUV light generation controller 5.

Next, the laser controller 55 may determine whether the laser controller 55 has received a burst signal BT from the exposure apparatus 6 (S182). If the laser controller 55 has not received a burst signal BT from the exposure apparatus 6 (S182: N), the laser controller 55 may repeat Step S182.

If the laser controller 55 has received a burst signal BT from the exposure apparatus 6 (S182: Y), the laser controller 55 may acquire a number of burst pulses Np and a number of bursts Kp (S183). The number of burst pulses Np is the number of pulses of the first pre-pulse laser beam PP1 in each burst. The number of bursts Kp is the number of bursts to be generated in the current exposure processing. The laser controller 55 may hold the values of the number of burst pulses Np and the number of bursts Kp in advance or acquire the values from the burst signal BT. Next, the laser controller 55 may determine the pulse energies Ep1 to EpCp for the first pulse to the Cp-th pulse (S184).

Next, the laser controller 55 may shift to the exposure bursts. First, the laser controller 55 may substitute 1 for a variable K (S185). The variable K represents the number of bursts already generated. The laser controller 55 may emit the first pulse to the Cp-th pulse at the pulse energies Ep1 to EpCp (S186). Subsequently, the laser controller 55 may emit the (Cp+1)th pulse to the Np-th pulse (S187).

Next, the laser controller 55 may determine whether the variable K has reached the number of bursts Kp (S188). If the variable K has not reached the number of bursts Kp (S188: N), the laser controller 55 may add 1 to the variable K (S189) and return to Step S186. If the variable K has reached the number of bursts Kp (S188: Y), the laser controller 55 terminates this processing.

Figure 20:
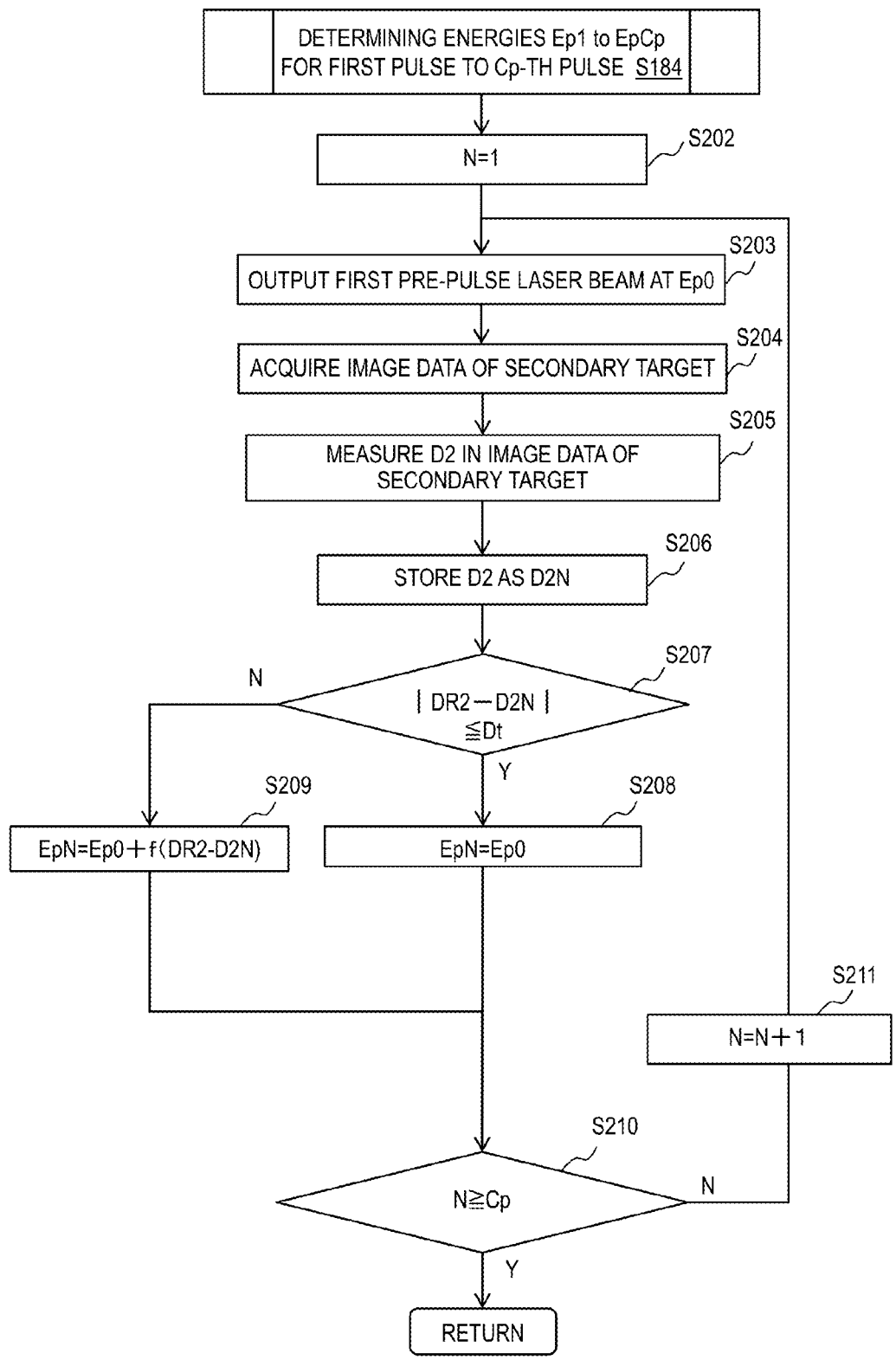
FIG. 20 is a detailed flowchart of Step S184 in FIG. 19.

FIG. 20 is a detailed flowchart of Step S184 in FIG. 19. At Step S184 in a learning burst, the laser controller 55 may measure the mist diameter of the secondary target 271 at the first to the Cp-th pulses and further, determine the pulse energies for the first to the Cp-th pulses based on the measured mist diameters.

In the flowchart of FIG. 20, Steps S202 to S206 are the same as Steps S142 to S146 in the flowchart of FIG. 16 described in Embodiment 3; the explanation is omitted herein. Steps S207 to S209 in the flowchart of FIG. 20 are the same as Steps S163 to S165 in the flowchart of FIG. 17 described in Embodiment 3; the explanation is omitted herein.

After executing Step S208 or S209 in the flowchart of FIG. 20, the laser controller 55 may determine whether the variable N has reached the pulse count Cp to switch the control (S210). If the variable N has not reached Cp (S210: N), the laser controller 55 may add 1 to the variable N and return to Step S203. If the variable N has reached Cp (S210: Y), the laser controller 55 may return to the processing in FIG. 19.

Figure 21:
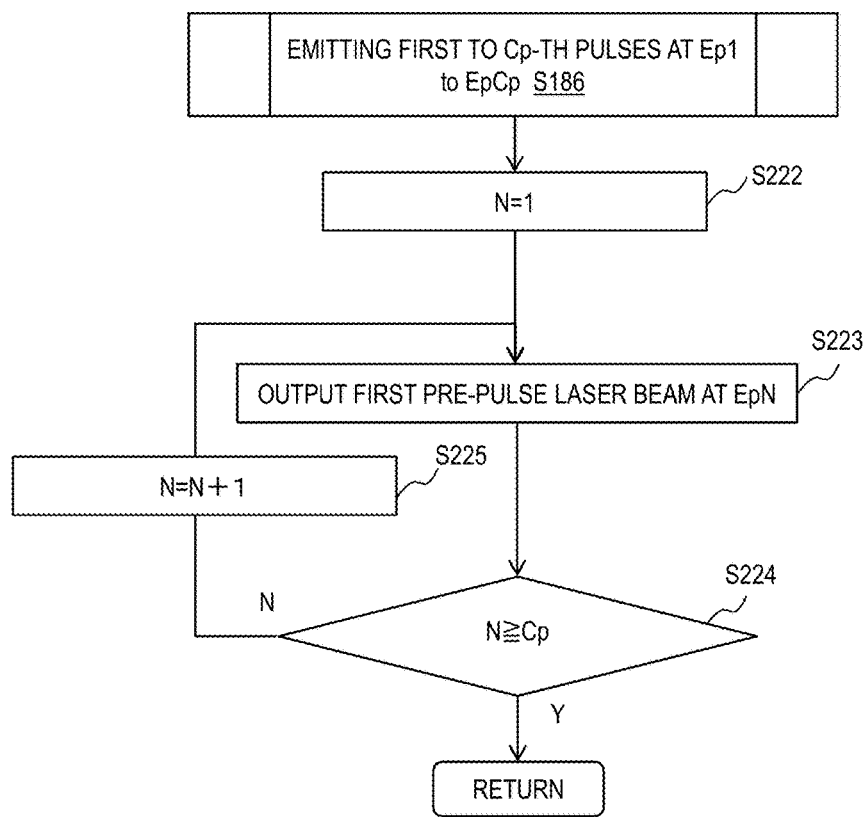
FIG. 21 is a detailed flowchart of Step S186 in FIG. 19.

FIG. 21 is a detailed flowchart of Step S186 in FIG. 19. At Step S186 in each exposure burst, the laser controller 55 may make the first pre-pulse laser apparatus 301 output pulses having the energies determined at Step S184.

First, the laser controller 55 may substitute 1 for the variable N (S222). Next, the laser controller 55 may make the first pre-pulse laser apparatus 301 emit the N-th pulse at the determined pulse energy EpN (S223).

Next, the laser controller 55 may determine whether the variable N has reached the pulse count Cp to switch the control (S224). If the variable N has not reached the pulse count Cp to switch the control (S224: N), the laser controller 55 may add 1 to the variable N (S225) and return to Step S223. If the variable N has reached the pulse count Cp to switch the control (S224: Y), the laser controller 55 may return to the processing in FIG. 19.

Figure 22:
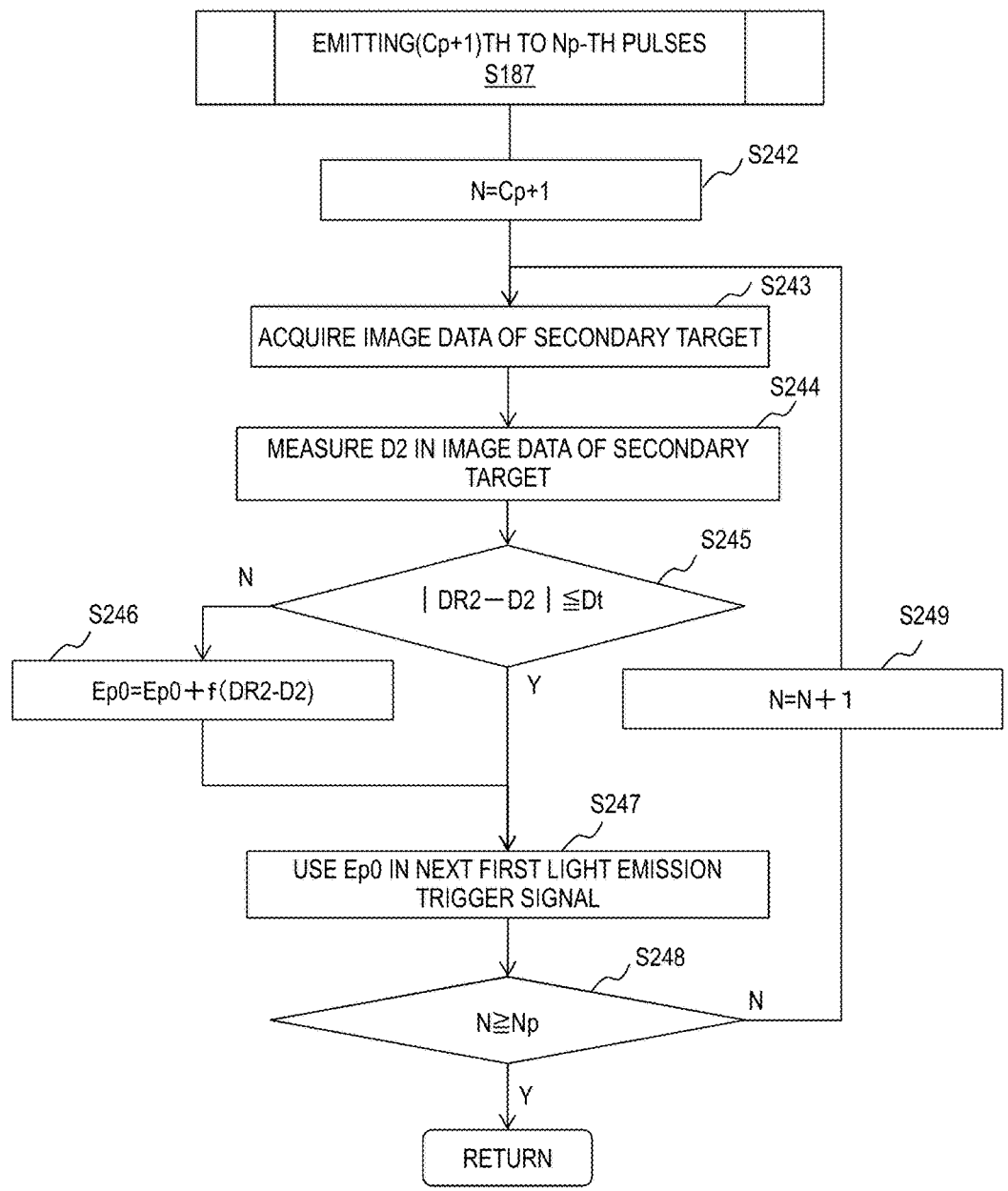
FIG. 22 is a detailed flowchart of Step S187 in FIG. 19.

FIG. 22 is a detailed flowchart of Step S187 in FIG. 19. At Step S187 of each exposure burst, the laser controller 55 may make the first pre-pulse laser apparatus 301 output the (Cp+1)th and subsequent pulses through the same control as the control in Embodiment 2.

First, the laser controller 55 may substitute (Cp+1) for the variable N (S242). Steps S243 to S247 are the same as Steps S102 to S106 in the flowchart of FIG. 11 described in Embodiment 2. However, the pulse energy EP1 in FIG. 11 is changed to the pulse energy Ep0.

After executing Step S247, the laser controller 55 may determine whether the variable N has reached the number of burst pulses Np (S248). If the variable N has not reached the number of burst pulses Np (S248: N), the laser controller 55 may add 1 to the variable N (S249) and return to Step S243. If the variable N has reached the number of burst pulses Np (S248: Y), the laser controller 55 may return to the processing in FIG. 19.

9.3 Effects

The present embodiment may switch the pulse energy control in accordance with the number of pulses emitted in a burst of the first pre-pulse laser beam PP1 to achieve appropriate pulse energy control of the first pre-pulse laser beam PP1 that meets the variation in mist diameter of the secondary target 271 within the burst and prevents the variation in EUV light energy more appropriately.

10. EMBODIMENT 5

10.1 Overview

Figure 23:
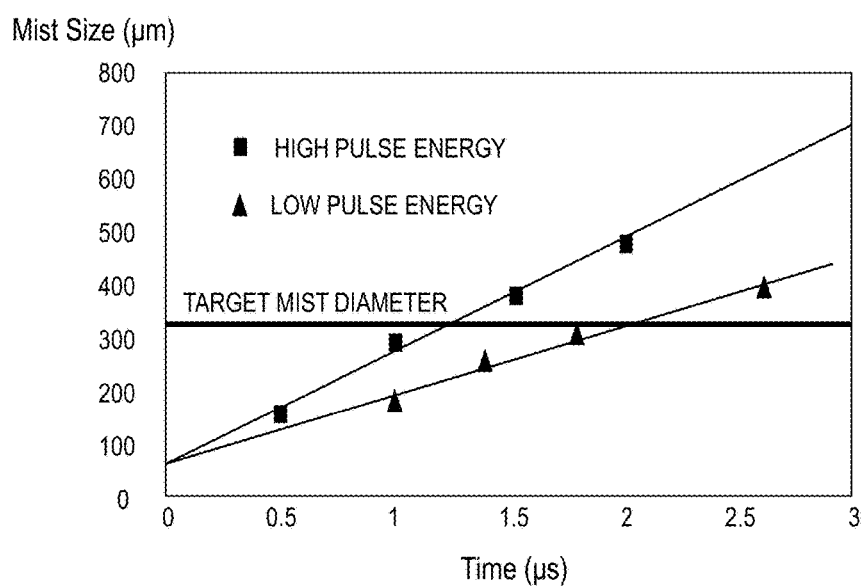
FIG. 23 shows temporal variations in measured mist diameter of a secondary target in Embodiment 5.

FIG. 23 shows temporal variations in measured mist diameter of a secondary target 271. After the start of irradiation with the first pre-pulse laser beam PP1, the mist diameter may increase substantially linearly with time. The gradient of the temporal variation in mist diameter may depend on the pulse energy of the first pre-pulse laser beam PP1. The intercept of the temporal variation in mist diameter may be substantially the same regardless of the pulse energy of the first pre-pulse laser beam PP1. The reason why the intercept exists in the mist diameter may be presumed as follows. A droplet may be broken up into a mist and explosively disperse because of the reaction to the plasma ablation caused by the irradiation with the first pre-pulse laser beam. The time period in which the mist disperses explosively is so short that the mist diameter in the period may be regarded as an intercept in the time scale of FIG. 23. After generation of plasma, the particles composing the mist are dispersed by the inertia force; accordingly, the dispersion velocity may be regarded as almost uniform when seen macroscopically.

The EUV light generation system 11 in the present embodiment may measure the mist diameter when a predetermined time has passed after emission of the first pre-pulse laser beam PP1 and estimate the time the optimum mist diameter will be obtained based on the measured value and a predefined function. The EUV light generation system 11 may irradiate the secondary target 271 with the second pre-pulse laser beam PP2 at the estimated time. The function may be determined based on the assumption that the mist diameter varies linearly with time.

The EUV light generation system 11 may measure the mist diameter of the secondary target 271 at a plurality of different times and calculate the dispersion velocity of the secondary target 271 based on the times of measurement and the measured mist diameters. The EUV light generation system 11 may determine the time when the secondary target 271 becomes a desired size based on the measured mist diameters and the calculated dispersion velocity.

Alternatively, the EUV light generation system 11 may measure the mist diameter of the secondary target 271 at a single predetermined time and calculate the dispersion velocity of the secondary target 271 based on the time of measurement, the measured mist diameter, a reference time of measurement and a reference mist diameter. The EUV light generation system 11 may determine the time when the secondary target 271 becomes a desired size based on the measured mist diameter and the calculated dispersion velocity.

The EUV light generation system 11 may control the emission timing of the second pre-pulse laser apparatus 302 so that the second pre-pulse laser apparatus 302 will emit a second pre-pulse laser beam PP2 at the determined time. The EUV light generation system 11 may further control the emission timing of the main pulse laser apparatus 303 in relation to the emission timing of the second pre-pulse laser apparatus 302. The energy of the first pre-pulse laser beam may be uniform.

Controlling the emission timing of the second pre-pulse laser beam PP2 based on the measured mist diameter of the secondary target 271 may maintain the mist diameters of the secondary targets 271 to be irradiated with the second pre-pulse laser beam to be substantially uniform and maintain the EUV light energy to be substantially uniform.

10.2 Operation

Figure 24:
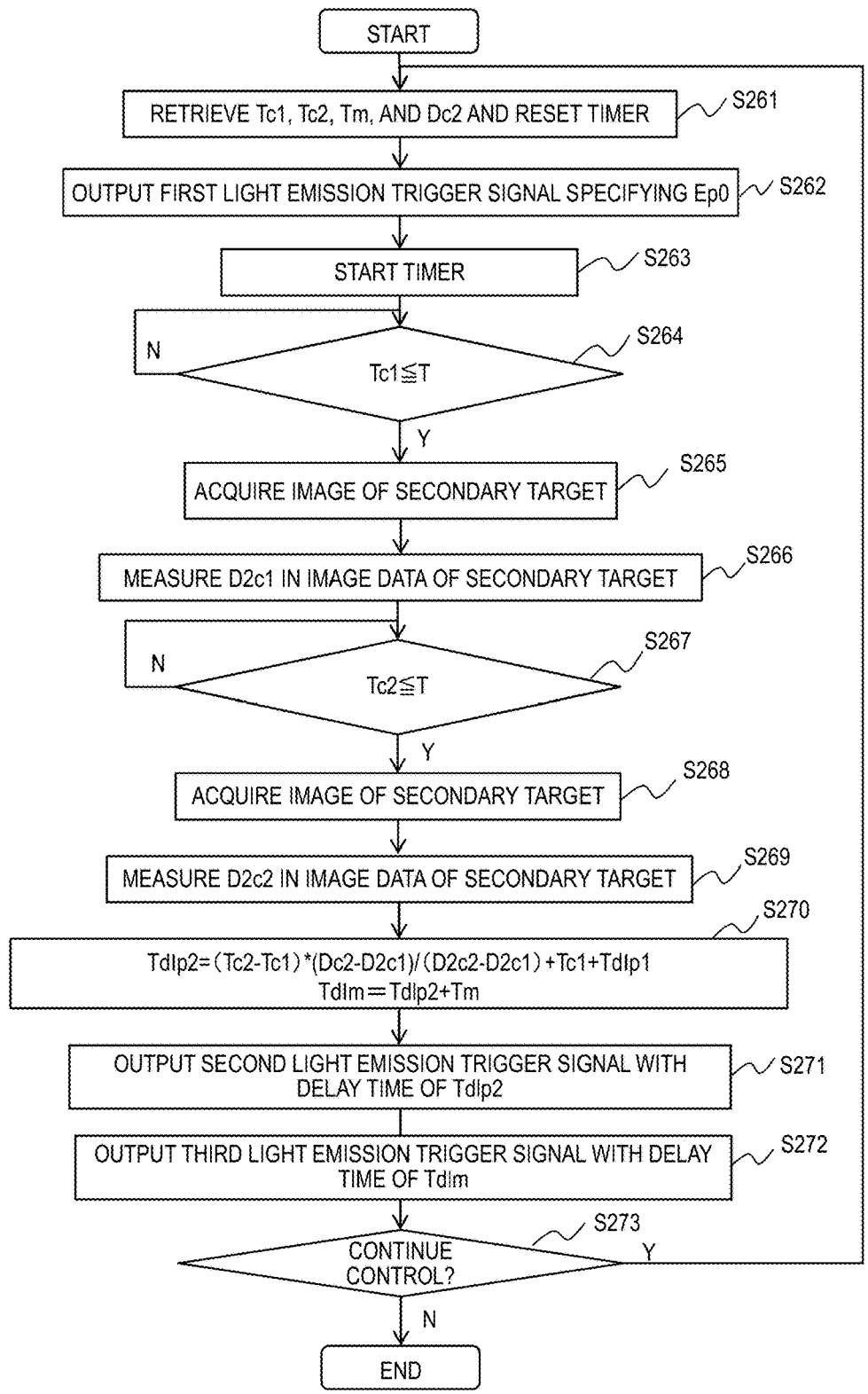
FIG. 24 is a flowchart of operation of a laser controller in Embodiment 5.

Hereinafter, operation in the present embodiment is specifically described. The configuration of the EUV light generation system 11 in the present embodiment may be the configuration shown in FIGS. 1 to 4. FIG. 24 is a flowchart of the operation of the laser controller 55 in the present embodiment. In the processing, the laser controller 55 may measure the mist diameter of a secondary target 271 twice and determine the time to emit the second pre-pulse laser beam PP2 and the time to emit the main pulse laser beam MP based on the measurement results.

First, the laser controller 55 may retrieve a first measurement delay time Tc1, a second measurement delay time Tc2, a delay time Tm, and a target mist diameter Dc2, and reset a timer (S261). These values of Tc1, Tc2, Tm, and Dc2 may be inputted by an operator or may be held in advance in the EUV light generation controller 5. The first measurement delay time Tc1 is a time period from output of the first light emission trigger signal ET1 until the first capture of the image of the secondary target 271. The second measurement delay time Tc2 is a time period from output of the first light emission trigger signal ET1 until the second capture of the image of the secondary target 271.

The delay time Tm is a time period from output of the second light emission trigger signal ET2 until output of the third light emission trigger signal ET3. The target mist diameter Dc2 is a desired mist diameter for the secondary target 271 to be irradiated with the second pre-pulse laser beam PP2.

Next, the laser controller 55 may output a first light emission trigger signal ET1 specifying a predetermined pulse energy Ep0 at a time delayed from the passage timing signal PT by a delay time Tdlp1 (S262). Next, the laser controller 55 may start counting the time with the timer (S263).

Next, the laser controller 55 may determine whether the time T counted by the timer has reached the first measurement delay time Tc1 (S264). If the time T counted by the timer has not reached the first measurement delay time Tc1 (S264: N), the laser controller 55 may repeat Step S264. If the time T counted by the timer has reached the first measurement delay time Tc1 (S264: Y), the laser controller 55 may acquire first image data of the secondary target 271 from the image measurement device 460 (S265). Next, the laser controller 55 may measure the mist diameter $D2c1$ of the secondary target 271 in the first image data (S266).

Next, the laser controller 55 may determine whether the time T counted by the timer has reached the second measurement delay time Tc2 (S267). If the time T counted by the timer has not reached the second measurement delay time Tc2 (S267: N), the laser controller 55 may repeat Step S267. If the time T counted by the timer has reached the second measurement delay time Tc2 (S267: Y), the laser controller 55 may acquire second image data of the secondary target 271 from the image measurement device 460 (S268). Next, the laser controller 55 may measure the mist diameter $D2c2$ of the secondary target 271 in the second image data (S269).

Next, the laser controller 55 may determine the time to output the second light emission trigger signal ET2 and the time to output the third light emission trigger signal ET3 (S270). In the present example, the laser controller 55 may calculate the delay time Tdlp2 between the passage timing signal PT and the second light emission trigger signal ET2 and the delay time Tdlm between the passage timing signal PT and the third light emission trigger signal ET3.

Specifically, the value of Tdlp2 may be determined based on the measured mist diameters $D2c1$, $D2c2$ of the secondary target 271, the first measurement delay time Tc1, the second measurement delay time Tc2, the target mist diameter Dc2, and the delay time Tdlp1 for the first light emission trigger signal ET1.

For example, Tdlp2 may be expressed in the following formula:

$$Tdlp2=(Tc2-Tc1)*(Dc2-D2c1)/(D2c2-D2c1)+Tc1+Tdlp1$$

The value of Tdlm may be determined based on the calculated Tdlp2 and Tm acquired in advance. For example, Tdlm may be expressed in the following formula:

$$Tdlm=Tdlp2+Tm.$$

Next, the laser controller 55 may output the second light emission trigger signal ET2 when the delay time Tdlp2 has passed after the passage timing signal PT (S271). Next, the laser controller 55 may output the third light emission trigger signal ET3 when the delay time Tdlm has passed after the passage timing signal PT (S272).

Next, the laser controller 55 may determine whether to continue the timing control for the second pre-pulse laser beam PP2 and the main pulse laser beam MP, based on the burst signal BT (S273). If the determination is to continue the control (S273: Y), the laser controller 55 may return to Step S261. If the determination is not to continue the control (S273: N), the laser controller 55 may terminate the processing.

Figure 25:
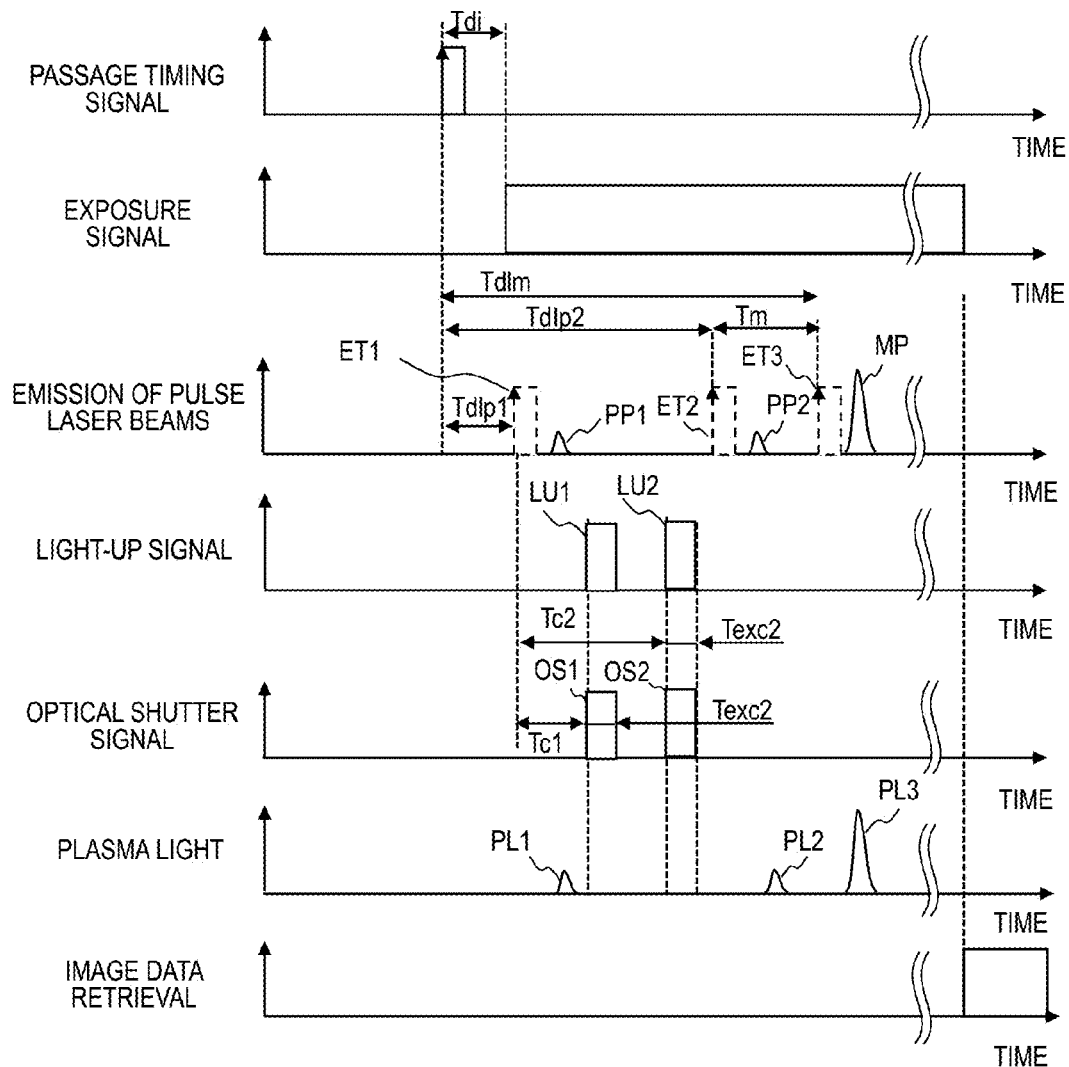
FIG. 25 is a time chart related to image measurement by the laser controller in Embodiment 5.

FIG. 25 is a time chart related to the image measurement by the laser controller 55 in the present embodiment. Hereinafter, differences from the time chart of FIG. 7 are mainly described. The laser controller 55 may output a light-up signal LU1 and an optical shutter signal OS1 when the time Tc1 has passed after outputting the first light emission trigger signal ET1. The lighting period and the shutter open period may be both Texc2. The image measurement device 460 may take an image of the secondary target 271 in response to the light-up signal LU1 and the optical shutter signal OS1 and send the first image data to the laser controller 55.

The laser controller 55 may output a light-up signal LU2 and an optical shutter signal OS2 when the time Tc2 has passed after outputting the first light emission trigger signal ET1. The lighting period and the shutter open period may be both Texc2. The image measurement device 460 may take an image of the secondary target 271 in response to the light-up signal LU2 and the optical shutter signal OS2 and send the second image data to the laser controller 55.

Figure 26:
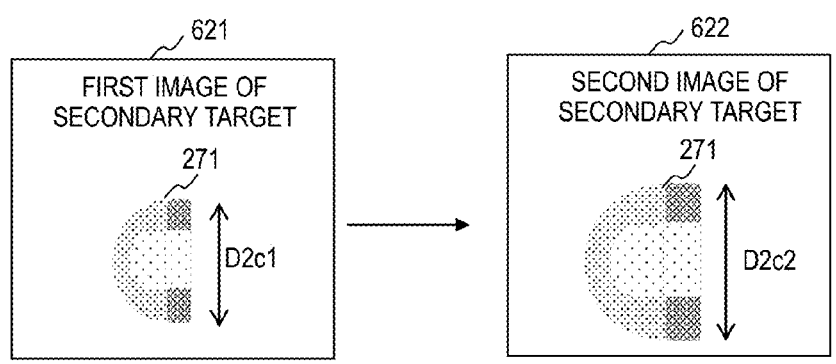
FIG. 26 shows images of a secondary target taken by an image measurement device in Embodiment 5.

FIG. 26 shows a first image 621 and a second image 622 of the secondary target 271 taken by the image measurement device 460. The first image 621 shows the secondary target 271 captured when the time Tc1 has passed after the first light emission trigger signal ET1. The second image 622 shows the secondary target 271 captured when the time Tc2 has passed after the first light emission trigger signal ET1. The mist diameter of the secondary target 271 increases from $D2c1$ to $D2c2$ with passage of time.

The laser controller 55 may calculate the delay time Tdlp2 for the second light emission trigger signal ET2 based on the measured mist diameters $D2c1$ and $D2c2$, using the method described with reference to FIG. 25. Furthermore, the laser controller 55 may calculate the delay time Tdlm for the main pulse laser beam MP based on the calculated delay time Tdlp2 and the predetermined delay time Tm.

The laser controller 55 may output the second light emission trigger signal ET2 to the second pre-pulse laser apparatus 302 with the calculated delay time of Tdlp2 after the passage timing signal PT. The laser controller 55 may output the third light emission trigger signal ET3 to the main pulse laser apparatus 303 with the calculated delay time of Tdlm after the passage timing signal PT.

10.3 Effects

The above-described configuration may accurately estimate the time when the secondary target 271 will become a desired size by measuring the mist diameter of a secondary target 271 at different times and determining the time to emit the second pre-pulse laser beam based on the measured mist diameters. As a result, the variation in EUV light energy may be prevented more appropriately.

10.4 Another Operation

Figure 27:
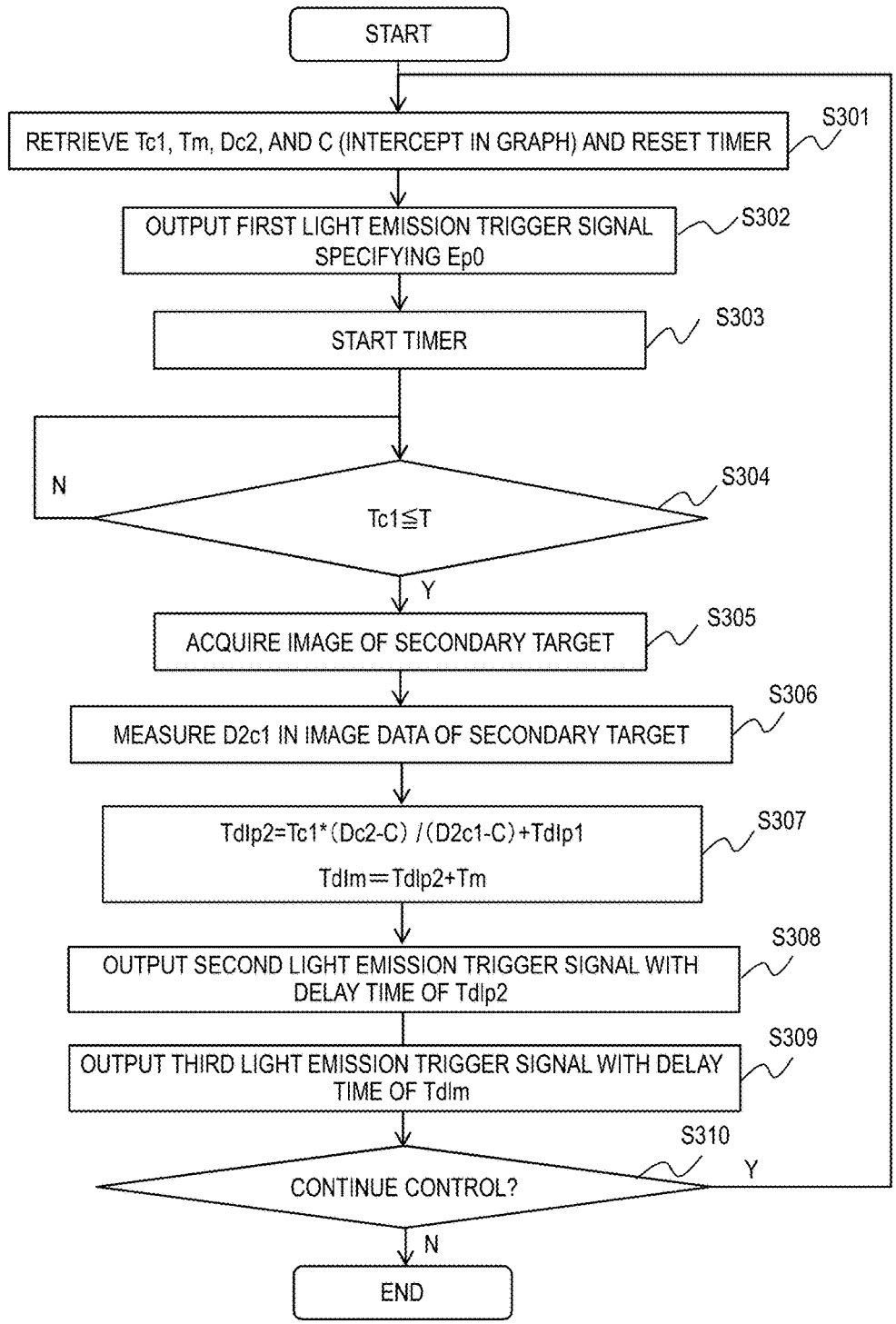
FIG. 27 is a flowchart of another method of determining the time to emit the second pre-pulse laser beam in Embodiment 5.

The laser controller 55 may determine the time to emit the second pre-pulse laser beam PP2 using a method different from the method of the flowchart of FIG. 25. FIG. 27 is a flowchart of another method of determining the time to emit the second pre-pulse laser beam PP2.

In this processing, the laser controller 55 may measure the mist diameter of a secondary target 271 using image data taken one time and determine the time to emit the second pre-pulse laser beam PP2 based on the measured mist diameter, the time of measurement, a predetermined reference mist diameter, and a predetermined reference time of measurement. This method may determine the time to emit the second pre-pulse laser beam PP2 based on an assumption that the mist diameter varies linearly with time.

First, the laser controller 55 may retrieve a measurement delay time Tc1, a delay time Tm, a target mist diameter Dc2, and an intercept C, and reset a timer (S301). These values of Tc1, Tm, Dc2, and C may be inputted by an operator or may be held in advance in the EUV light generation controller 5. The measurement delay time Tc1 may be a delay time for specifying the reference time of measurement in this processing. The intercept C may be an intercept in the relation between the mist diameter and the time counted by the timer and indicate a reference mist diameter at the reference time of measurement. For example, in a case where the timer starts counting at a reference time of measurement of 0 μs in a system to which the measurement results shown in FIG. 23 are applicable, the intercept C may be the mist diameter at the time of 0 μs. Steps S302 to S306 are the same as Steps S262 to S266 in the flowchart of FIG. 24; the explanation is omitted herein.

After executing Step S306, the laser controller 55 may determine the time to output the second light emission trigger signal ET2 and the time to output the third light emission trigger signal ET3 (S307). In the present example, the laser controller 55 may calculate the delay time Tdlp2 between the passage timing signal PT and the second light emission trigger signal ET2 and the delay time Tdlm between the passage timing signal PT and the third light emission trigger signal ET3.

Specifically, the value of Tdlp2 may be determined based on the measured mist diameter D2c1 of the secondary target 271, the measurement delay time Tc1, the target mist diameter Dc2, the intercept C, and the delay time Tdlp1 for the first light emission trigger signal ET1.

For example, Tdlp2 may be expressed in the following formula:

$$Tdlp2=Tc1*(Dc2-C)/(D2c1-C)+Tdlp1.$$

The value of Tdlm may be determined based on the calculated Tdlp2 and Tm acquired in advance. For example, Tdlm may be expressed in the following formula:

$$Tdlm=Tdlp2+Tm.$$

Steps S308 to S310 are the same as Steps S271 to S273 in the flowchart of FIG. 24; the explanation is omitted herein.

10.5 Effects

The method described with reference to FIG. 27 determines the time to emit the second pre-pulse laser beam PP2 with a single capture of an image of the secondary target 271; accordingly, a system that requires a long time to measure the mist diameter using image data may appropriately determine the time to emit the second pre-pulse laser beam PP2. As a result, the variation in EUV light energy may be prevented.

The laser control in the present disclosure may be applicable to an EUV light generation system that irradiates a target with three or more pre-pulse laser beams and a system that irradiates a target with the main pulse laser beam after one pre-pulse laser beam. The multiple laser pulses to hit the same target may be outputted from the same laser apparatus.

As set forth above, the present invention has been described with reference to embodiments; however, the foregoing description is merely provided for the purpose of exemplification but not limitation. A part of the configuration of an embodiment may be replaced with a configuration of another embodiment. A configuration of an embodiment may be incorporated to a configuration of another embodiment. A part of the configuration of each embodiment may be removed, added to a different configuration, or replaced by a different configuration.

The terms used in this specification and the appended claims should be interpreted as "non-limiting". For example, the terms "include" and "be included" should be interpreted as "including the stated elements but not limited to the stated elements". The term "have" should be interpreted as "having the stated elements but not limited to the stated elements". Further, the modifier "one (a/an)" should be interpreted as "at least one" or "one or more."

What is claimed is:

1. An extreme ultraviolet light generation system configured to generate extreme ultraviolet light by irradiating a target with a pulse laser beam three times, the extreme ultraviolet light generation system comprising:
a target supply device configured to supply a first primary target and supply a second primary target after the first primary target;
a laser system configured to provide a pulse laser beam to each primary target supplied from the target supply device; and
a controller,
wherein the laser system is configured to:
irradiate the first primary target with a first pulse laser beam to break and disperse the first primary target and produce a secondary target being a mist target;
irradiate the secondary target with a second pulse laser beam to produce a tertiary target including at least vapor or pre-plasma; and
irradiate the tertiary target with a third pulse laser beam to generate extreme ultraviolet light, and
wherein the controller is configured to:
measure a mist diameter of the secondary target; and
control energy of a first pulse laser beam to be used to irradiate the second primary target based on the mist diameter.

2. The extreme ultraviolet light generation system according to claim 1, wherein the controller is configured to determine the energy of the first pulse laser beam to be used to irradiate the second primary target based on a difference between the mist diameter and a predetermined reference mist diameter.

3. The extreme ultraviolet light generation system according to claim 2, wherein the controller is configured to determine the energy of the first pulse laser beam to be used to irradiate the second primary target to be the same as the energy of the first pulse laser beam used to irradiate the first primary target in a case where the difference between the mist diameter and the reference mist diameter is equal to or smaller than a threshold.

4. The extreme ultraviolet light generation system according to claim 1, wherein the controller is configured to:
measure mist diameters at pulses of different pulse counts in one or more learning bursts;
determine energy of the first pulse laser beam by determining energies of the pulses at the different pulse counts in the first pulse laser beam based on the measured mist diameters; and emit a first pulse laser beam while outputting pulses at the energies determined correspondingly to the different pulse counts in bursts subsequent to the one or more learning bursts.

5. The extreme ultraviolet light generation system according to claim 4, wherein the controller is configured to:
control the energy of the first pulse laser beam based on the mist diameters measured in the one or more learning bursts for a specified number of pulses from beginning of a burst; and
control the energy of the first pulse laser beam based on a mist diameter already measured in the burst for each pulse subsequent to the specified number of pulses in the burst.

6. The extreme ultraviolet light generation system according to claim 1,
wherein the extreme ultraviolet light generation system is configured to supply the second primary target in a burst different from a burst in which the first primary target is supplied, and
wherein a pulse count from beginning of the different burst at which the second primary target is supplied is the same as a pulse count from beginning of the burst at which the first primary target is supplied.

7. The extreme ultraviolet light generation system according to claim 1, further comprising an energy sensor configured to measure the energy of the first pulse laser beam,
wherein the controller is configured to control the energy of the first pulse laser beam based on a result of measurement by the energy sensor.

8. The extreme ultraviolet light generation system according to claim 1, wherein the secondary target includes a dome part.

9. The extreme ultraviolet light generation system according to claim 1, wherein a density of an inner area of the secondary target is lower than a density of an outer area of the secondary target.

10. The extreme ultraviolet light generation system according to claim 1, wherein a density of an inner area of the secondary target is lower than a density of an outer area of the secondary target.

11. An extreme ultraviolet light generation system configured to generate extreme ultraviolet light by irradiating a target with a pulse laser beam three for a plurality times, the extreme ultraviolet light generation system comprising:
a target supply device configured to supply a primary target;
a laser system configured to provide a pulse laser beam to the primary target supplied from the target supply device; and
a controller,
wherein the laser system is configured to:
irradiate the primary target with a first pulse laser beam to produce a secondary target being a mist target;
irradiate the secondary target with a second pulse laser beam to produce a tertiary target including at least vapor or pre-plasma; and
irradiate the tertiary target with a third pulse laser beam to generate extreme ultraviolet light, and
wherein the controller is configured to:
measure a first mist diameter of the secondary target; and
control time to emit the second pulse laser beam based on the first mist diameter.

12. The extreme ultraviolet light generation system according to claim 11, wherein the controller is configured to:
measure a second mist diameter of the secondary target at a time different from a time of measurement of the first mist diameter; and
control the time to emit the second pulse laser beam based on the first mist diameter and the second mist diameter.

13. The extreme ultraviolet light generation system according to claim 11, wherein the controller is configured to control the time to emit the second pulse laser beam based on the first mist diameter and a predetermined reference mist diameter.

14. The extreme ultraviolet light generation system according to claim 11, wherein the secondary target includes a dome part.

15. A method of generating extreme ultraviolet light by irradiating a target with a pulse laser beam, the method comprising:
irradiating a first primary target with a first pulse laser beam;
measuring a mist diameter of a secondary target generated from the first primary target irradiated with the first pulse laser beam, the secondary target being a mist target;
irradiating the secondary target with a second pulse laser beam to produce a tertiary target including at least vapor or pre-plasma;
irradiating the tertiary target with a third pulse laser beam to generate extreme ultraviolet light; and
controlling energy of a first pulse laser beam to be used to irradiate a second primary target supplied after the first primary target, based on the mist diameter.

* * * * *